(12) United States Patent
Matsumoto et al.

(10) Patent No.: US 7,768,314 B2
(45) Date of Patent: Aug. 3, 2010

(54) INTEGRATED CIRCUIT WITH MULTIDIMENSIONAL SWITCH TOPOLOGY

(75) Inventors: Yohei Matsumoto, Kakogawa (JP); Akira Masaki, Musashino (JP)

(73) Assignee: National University Corporation Okayama University, Okayama (JP)

( * ) Notice: Subject to any disclaimer, the term of this patent is extended or adjusted under 35 U.S.C. 154(b) by 263 days.

(21) Appl. No.: 11/596,011
(22) PCT Filed: Mar. 28, 2005
(86) PCT No.: PCT/JP2005/005755

§ 371 (c)(1),
(2), (4) Date: Jul. 31, 2008

(87) PCT Pub. No.: WO2005/109646

PCT Pub. Date: Nov. 17, 2005

(65) Prior Publication Data

US 2009/0009215 A1    Jan. 8, 2009

(30) Foreign Application Priority Data

May 12, 2004   (JP)   ............... 2004-170571
Sep. 28, 2004   (JP)   ............... 2004-281528

(51) Int. Cl.
*H03K 19/173* (2006.01)
*G05F 1/10* (2006.01)
*H01F 38/14* (2006.01)

(52) U.S. Cl. ............ 326/101; 326/47; 326/41; 326/38; 326/39; 327/538; 307/104; 716/16

(58) Field of Classification Search .......... 326/47, 326/101, 82, 83; 716/12–14, 17
See application file for complete search history.

(56) References Cited

U.S. PATENT DOCUMENTS

RE34,363 E    8/1993   Freeman (Continued)

FOREIGN PATENT DOCUMENTS

TW    277184    6/1996

(Continued)

OTHER PUBLICATIONS

M. J. Alexander et al., "Three-Dimensional Field-Programmable Gate Arrays" ASIC Conference and Exhibit 1995, Proceedings of the Eighth Annual IEEE International 1995, p. 253-256.

(Continued)

*Primary Examiner*—Vibol Tan
(74) *Attorney, Agent, or Firm*—Harness, Dickey & Pierce, P.L.C.

(57) ABSTRACT

An FPGA needs extremely large numbers of switches in its wiring architecture and therefore shows low logic density and low operating speed. This tendency becomes increasingly evident with high integration FPGAs. 3-dimensional FPGAs are getting attention for potential improvements in their operating speed and logic density. However, 3-dimensional integration processes have poor yield and are difficult to adapt for the production of devices with fine features. In addition, difficulty in heat radiation imposes limits on the number of stacks. The present invention exploits advantages of the 3-dimensional FPGA to deliver FPGAs with high speed/high integration and which resolves difficulty in manufacturing processes. The present invention solves problems by proposing a design method for an FPGA in which a high dimensional FPGA switch topology is embedded in a lower dimensional integrated circuit and a semiconductor integrated circuit including an FPGA in which a high dimensional FPGA switch topology is embedded in a lower dimensional integrated circuit.

21 Claims, 21 Drawing Sheets

U.S. PATENT DOCUMENTS

| | | |
|---|---|---|
| 5,396,126 A | 3/1995 | Britton et al. |
| 5,455,525 A | 10/1995 | Ho |
| 5,594,363 A | 1/1997 | Freeman et al. |
| 5,682,107 A | 10/1997 | Tavana |
| 5,689,195 A | 11/1997 | Cliff |
| 5,748,942 A | 5/1998 | Duncan |
| 5,883,526 A | 3/1999 | Reddy |
| 5,914,616 A | 6/1999 | Young |
| 5,942,913 A | 8/1999 | Young |
| 6,084,429 A * | 7/2000 | Trimberger ............ 326/41 |
| 6,094,066 A * | 7/2000 | Mavis ............ 326/41 |
| 6,242,947 B1 * | 6/2001 | Trimberger ............ 326/41 |
| 6,278,290 B1 * | 8/2001 | Young ............ 326/41 |
| 6,300,794 B1 | 10/2001 | Reddy |
| 7,457,303 B2 * | 11/2008 | Blumrich et al. ............ 370/406 |
| 7,486,619 B2 * | 2/2009 | Chen et al. ............ 370/235 |
| 2006/0225020 A1 * | 10/2006 | Chandrakasan et al. ....... 716/17 |

FOREIGN PATENT DOCUMENTS

| | | |
|---|---|---|
| TW | 314653 | 9/1997 |
| WO | WO 95/22205 | 8/1995 |
| WO | WO 98/43354 | 10/1998 |

OTHER PUBLICATIONS

Arifur Rahman et al., "Wiring Requirement and Three-Dimensional Integration of Field-Programmable Gate Arrays" Proc. SLIP, pp. 107-113, 2001.

Miriam Leeser et al., "Rothko: A Three-Dimensional FPGA" IEEE Design and Test of Computers, vol. 15(No. 1), pp. 16-23, 1998.

William J. Dally et al., "Performance Analysis of $k$-ary $n$-cube Interconnection Networks" IEEE Transactions on Computers. vol. 39, No. 6, pp. 775-785, 1990.

* cited by examiner

BACKGROUND ART

BACKGROUND ART

FIG. 4
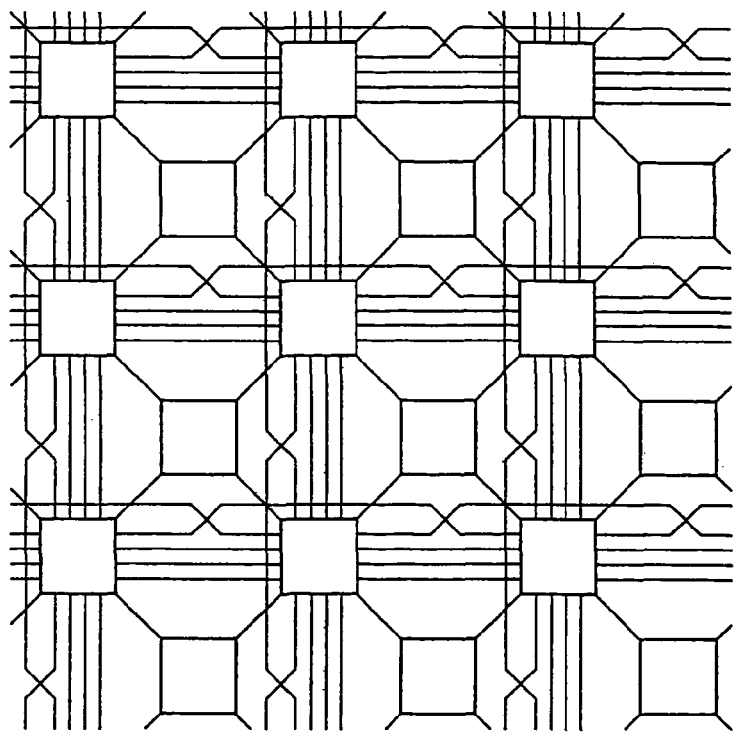
BACKGROUND ART
FIG. 5
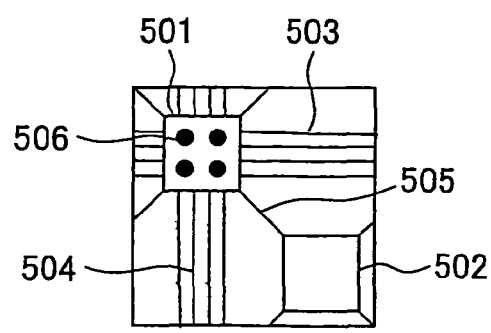
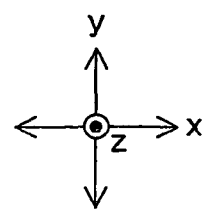
BACKGROUND ART

BACKGROUND ART

BACKGROUND ART

F I G. 1 2
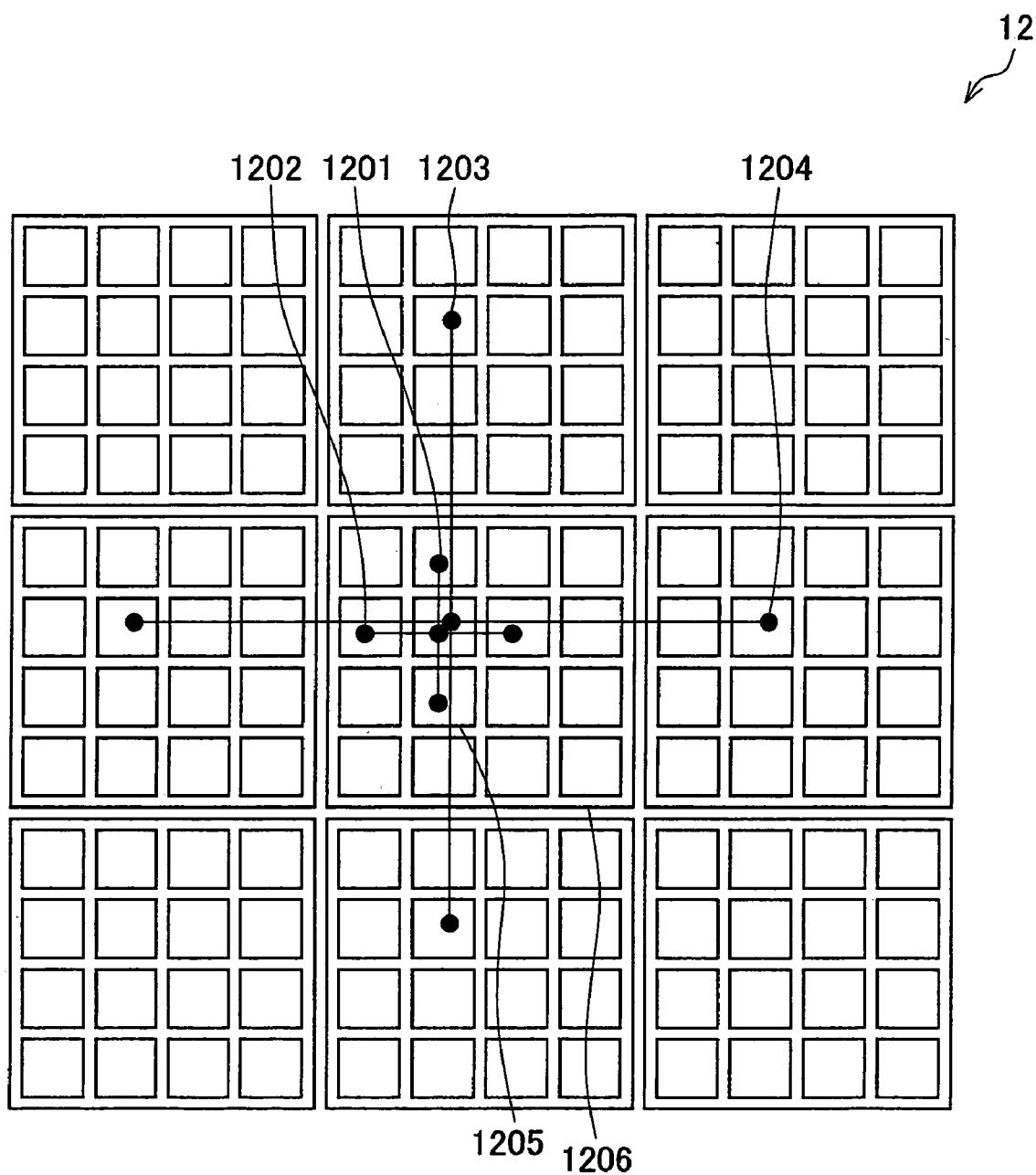

F I G. 1 4
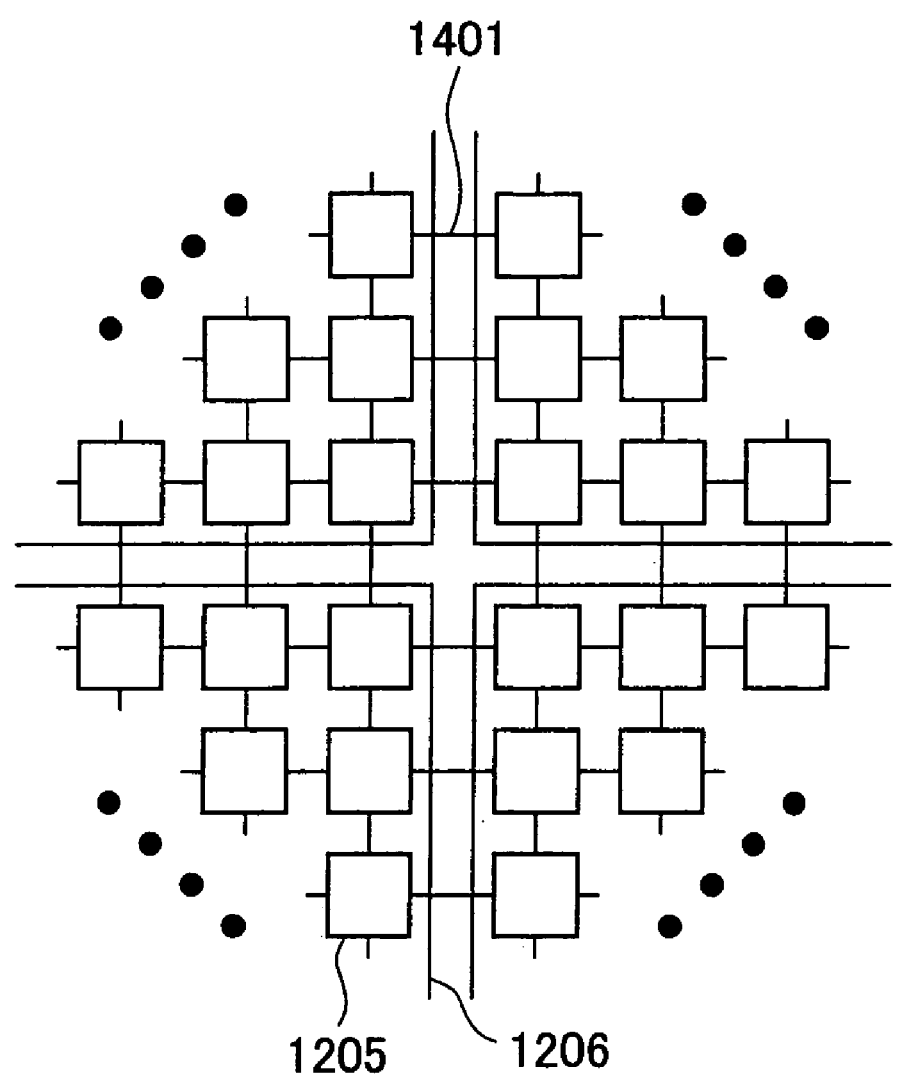

US 7,768,314 B2

INTEGRATED CIRCUIT WITH MULTIDIMENSIONAL SWITCH TOPOLOGY

PRIORITY STATEMENT

This application is the national phase under 35 U.S.C. §371 of PCT International Application No. PCT/JP2005/005755 which has an International filing date of Jul. 21, 2005, which designated the United States of America, the entire contents of which is hereby incorporated herein by reference, which application claims priority under 35 U.S.C. §119 on Japanese patent application number JP 2004-170571 filed May 12, 2004 and Japanese patent application JP 2004-281528 filed on Sep. 28, 2004, the entire contents of which are hereby incorporated herein by reference.

TECHNICAL FIELD

The present invention relates to the wiring architecture of the field programmable gate array ("FPGA") of which the logic functions are reconfigurable, and relates to wiring architectures which have a multidimensional switch topology and integrated circuits with such a wiring architecture. The present invention relates also to programmable devices containing a plurality of basic blocks and switching elements provided to the basic blocks, the basic blocks being connected to one another via the switching elements thereof.

BACKGROUND ART

There are many FPGA products of which the logic functions are reconfigurable. Patent documents 1 to 11 give exemplary structures of such FPGAs:

Patent Document 1: Published Japanese Translation of PCT Application 8-509344/1996 (Tokuhyohei 8-509344; published on Oct. 1, 1996)

Patent Document 2: Published Japanese Translation of PCT Application (Tokuhyo) 2001-519133 (published on Oct. 16, 2001)

Patent Document 3: U.S. Pat. RE 34,363 (published on Aug. 31, 1993)

Patent Document 4: U.S. Pat. No. 5,455,525 (published on Oct. 3, 1995)

Patent Document 5: U.S. Pat. No. 5,682,107 (published on Oct. 28, 1997)

Patent Document 6: U.S. Pat. No. 5,689,195 (published on Nov. 18, 1997)

Patent Document 7: U.S. Pat. No. 5,883,526 (published on Mar. 16, 1999)

Patent Document 8: U.S. Pat. No. 5,914,616 (published on Jan. 22, 1999)

Patent Document 9: U.S. Pat. No. 5,942,913 (published on Aug. 24, 1999)

Patent Document 10: U.S. Pat. No. 6,084,429 (published on Jul. 4, 2000)

Patent Document 11: U.S. Pat. No. 6,300,794 (published on Oct. 9, 2001)

As described in patent documents 1, 2, 5, 8, 9, the FPGA generally contains basic blocks as shown in FIG. 1a being arranged in a 2-dimensional array as in FIG. 4. The following will take the x-direction to be the lateral direction and the y-direction to be the longitudinal direction for descriptive purposes. A typical basic block includes wire channels 106, 107 which connect the block to other ones, a switch matrix 101 specifying paths, and a logic block 102 which contains reconfigurable logic elements and memory elements. The switch matrix 101 and the logic block 102 are connected via a wire 105. Wires 103 and a wire 104 also connect the basic block to other ones. The wires 103 connect it to an adjoining basic block. The wire 104 connects it to a basic block other than the next one.

FIG. 2 shows a concrete example of the logic block 102. In this example, the block includes lookup tables 202 as reconfigurable logic elements and D flip-flops 203 as memory elements. The lookup table 202 is provided in the form of a SRAM or other kind of memory. The output of the lookup table 202 and the D flip-flop 203 are fed back to the lookup table 202. The signals are also supplied to the switch matrix 101 via wires 105. Inputs from outside the basic block are also supplied to the lookup table 202 via the switch matrix 101 and the wires 105. Inputs to the lookup table 202 first go through programmable switches 201 provided to the lookup table 202. The switches 201 enables selection between the feedback inputs from the lookup table 202 and the D flip-flop 203 and inputs from outside the basic block via the wires 105. Some recent FPGAs include a logic block like the one in FIG. 2, but with an additional carry handling element. Some blocks are constructed entire of memory or multipliers.

FIG. 1b shows the topology of the switch matrix 101. The figure indicates by arrows the presence/absence of switches which connect the wire channel 106a located on the left hand side in terms along the x-direction to the wire channels 106b, 105a, 105b. In the 2-dimensional switch matrix 101, switches are needed which connects to wire channels in three directions. The figure shows only the connections from the wire channel 106a located on the left hand side along the x-direction to the remaining wire channels 106b, 105a, 105b; there exist switches, however, which connect each wire channel to the other wire channels.

The switch matrix 101 has switches shown in FIG. 3 to short-circuit wires which connect to basic blocks to the right/left/top/bottom, such as the wires 103 and wire 104 in FIG. 1a, with each other. The switch includes a multiplexer 301. The inputs of the multiplexer 301 are coupled to wires 303 which extend from wires connecting together the basic blocks to the right/left/top/bottom which connect to the switch matrix 101 and some of the wires 105 carrying outputs from the logic block 102. The inputs are selectively output to a tristate buffer 302. The buffer 302 drives one of wires, such as the wires 103 and the wire 104, which connect basic blocks to each other. The use of the tristate buffer 302 enables the wires to which its output is supplied (for example, wires 103) to be used in both directions. The tristate buffer 302 is can be replaced with an ordinary buffer. Furthermore, the switch may be arranged including no buffer at all. The switch is controlled by a SRAM or other memory.

The user makes suitable value settings in a switch-controlling memory and a lookup table-providing memory before use, so that the FPGA can operate as desired.

With shrinking feature sizes in semiconductor process technology, custom design is becoming a time consuming and expensive step. In contrast, the FPGA requires much less time and cost in logic function design because it is inherently reconfigurable. In addition, the FPGA has a regular structure to which the latest semiconductor process technology can be applied relatively easily. This is expected to contribute to greater integration. Newer semiconductor process technology is used with the FPGA than with the application specific integrated circuit ("ASIC"). The FPGA was primarily used as a prototype in its infancy. Equipped now with improved capabilities, it is gaining attention as a replacement for a DSP and small- and medium-sized ASIC. Its field of application is also expanding. The FPGA exhibits growing advantages with its shrinking feature size. The FPGA is expected to find applications in more new fields including mobile devices and digital household appliances.

A disadvantage of the FPGA is its extremely slow speed when compared to the ASIC because the FPGA wires extend passing through large numbers of switches. Another one is its extremely low logic density when compared to the ASIC because of the provision of the large numbers of switches in the FPGA. These problems become increasingly serious with greater integration which is inevitably accompanied by a long average wire length and a large wiring area. These problems need to be solved completely to realize a large scale FPGA.

To mitigate the situation, there is provided connecting wires which extend over some switch matrices like the wire 104 in FIG. 1a. The number of switch matrices over which the wires extend and the number of those wires need to be optimized carefully.

Another possible way to reduce the wires between the logic blocks 102 is to increase the grain size of the logic blocks 102. The logic block 102 in FIG. 2 includes two logic elements, each being a pair of a lookup table 202 and a flip-flop 203. Logic blocks including more logic elements (e.g., four) may be prepared. This is a similar structure to the FPGA having a hierarchical structure taught in patent document 6. Here, the FPGA as a whole is considered a superregion, and each basic block a subregion. The superregion has an ordinary 2-dimensional array structure. In a subregion, however, logic elements are equivalently connected together as in FIG. 2. The switch matrix is equivalently connected to each logic element in a subregion-superregion wire connection. In this structure, expansion of the subregion leads to large increases in switch counts and delays on internal wires.

These problems can be addressed by a modified design, like the segmentation of subregion internal wires as in patent document 7 and further hierarchization in the subregion as in patent document 11.

The window frame architecture disclosed, for example, in patent document 4 can be considered a kind of hierarchical structure. Here, connections in a subregion has a 2-dimensional array structure. Connections are made from the edges of a subregion to wire channels in a superregion. With this structure, expanding a subregion adds extra length to the wires of the superregion, which is only wasted. The problem can be addressed by a modified design in which wires in the superregion are segmented as in patent document 10, for example. The size of the subregion, connections in the subregion, etc. need to be optimized carefully also in wiring architectures based on the hierarchical structures.

Typical FPGAs are optimized with respect to these properties. It is however not clear whether the optimization will be effective in addressing future increases in wiring areas and delays of the FPGA. Accordingly, proposals are made for 3-dimensional FPGAs in, for example, non-patent documents 1 and 2 to solve problems relating to FPGA wiring.

Non-patent document 1: "Wiring Requirement and 3-dimensional Integration of Field-Programmable Gate Array," A. Rahman et al., Proc. SLIP, 2001.

Non-patent document 2: "Rothko: A 3-dimensional FPGA," M. Leeser et al., IEEE Design and Test of Computers, Vol. 15 (no. 1), pp. 16-23, 1998.

An example of a basic block in the 3-dimensional FPGA is shown in FIG. 5. The following will take the x-direction to be the lateral direction, the y-direction to be the longitudinal direction, and the z-direction to be the vertical direction of the chip. Wire channels 503 and 504 extend in the x and y-directions respectively. Another wire channel 506 extends in the z-direction. The wire channel 506 connects to a switch matrix 501 in a tile in an upper or lower layer. The switch matrix 501 and the logic block 502 in the basic block of FIG. 5 correspond respectively to the switch matrix 101 and the logic block 102 in the basic block in FIG. 1. FIG. 6a is a 3-dimensional view of the wires coupled to the switch matrix 501. FIG. 6b shows a topology for the switch matrix 501. To prevent the figure from becoming too complicated, the figure shows only the connections from a wire channel 503a located on the left hand side along the x-direction to wire channels 503b, 504a, 504b, 506a, 506b in other directions; there exist switches, however, which connect each wire channel to the other wire channels. Therefore, a switch matrix in the 3-dimensional FPGA needs switches connecting to five directions. Inside a switch matrix 501, each wire channel in each certain direction can connect to wire channels in all directions. FIG. 7 shows connections in a switch matrix 501 in the 3-dimensional FPGA.

In the structure, each basic block has an increased number of adjoining basic blocks. Connections between basic blocks travel through fewer switch matrices; wiring delays are thus reduced. In addition, the number of switches in the FPGA is in proportion to the number of tracks in a wire channel. (A wire channel is a bunch of wires. Each wire in the wire channel is called a track.) Connections are made to wire channels in three directions in a 2-dimensional switch matrix. In a 3-dimensional switch matrix, connections are made to those in five directions, and the number of switches per track increases. Since a large scale 3-dimensional FPGA needs much fewer tracks for wire channels than the 2-dimensional FPGA. The 3-dimensional FPGA has a higher logic density.

Non-patent document 1 states that an FPGA with 20k gates, if arranged 3-dimensionally in four layers, exhibits 45 to 60% less wiring delay and 20 to 40% greater integration of logic. The document also shows that improvements grow with increasing integration of logic. It is understood that the 3-dimensional integration is increasingly effective with greater scale FPGAs.

However, it is difficult to fabricate fine vertically running wires. The manufacture of the 3-dimensional FPGA, therefore, is extremely difficult. In addition, it is difficult for heat to radiate from 3-dimensional integrated circuits, and only a limited number of layers can be stacked. It is impossible to realize a 3-dimensional FPGA with sufficient integration in the foreseeable future.

DISCLOSURE OF INVENTION

Most of circuit delay in the FPGA is attributable to wiring delay. The growing wiring delay is caused by wires that extend via large numbers of switch matrices between basic blocks. In addition, as integration grows, the number of switch matrices through which a signal must travel increases, and so does the contribution of the wiring delay to the circuit delay.

Large parts of an FPGA chip area are occupied by transistors in switch matrices. Metal wire regions are insufficient in the ASIC. Meanwhile, transistor regions, rather than metal wire regions, are insufficient in the FPGA. In addition, as integration increases, the number of switches needed for switch matrices grows, and logic density decreases.

Studies on 3-dimensional FPGA manufacturing using 3-dimensional integration technology have been underway to find a solution to these two problems. In the 3-dimensional FPGA, the average wire length of connections between basic blocks, in other words, the number of switch stages through which a signal must pass, falls dramatically. Therefore, wiring delay, largely responsible for circuit delay in the FPGA, is greatly improved. In addition, in the 3-dimensional FPGA, the number of tracks needed for wire channels falls dramatically. Therefore, the number of transistors in switch matrices decreases, and integration of logic improves. However, 3-dimensional integration technology still has a lot of difficult problems that must be addressed. One of them is associated with through electrodes which connect different layers. Through electrodes connecting different layers are thick when compared to wires in the horizontal direction, and not many of them can be built in. This could be an obstacle for increasing integration. Furthermore, device manufacturing is technically difficult, keeping down yields. No 3-dimensional FPGA with sufficient integration has been realized. Another problem is the limited number of stacks in the 3-dimensional integrated circuit because of difficulty in heat radiation from the stacks. This fact gives another reason why it is difficult to make a 3-dimensional FPGA with sufficient integration. It is hence inferred that no thoroughly ideal 3-dimensional FPGA with the same properties in the horizontal direction and in the vertical direction could be realized in the foreseeable future. Therefore, today's 3-dimensional integrated circuit technology is not able to provide integrated circuits or systems including such an integrated circuit which are robust enough to address requirements for today's electronic equipment, such as increasing volume of information, growing functionality, and high speed.

The inventors of the subject invention have diligently worked on the research and development of a wiring architecture which exploits the advantages of the 3-dimensional FPGA (less wiring delay and greater integration of logic) and addresses disadvantages in process technology. As a result, the inventors have solved the above issues of the current 3-dimensional FPGA by embedding a multidimensional switch topology in a lower dimensional chip, which has led to the completion of the invention. Throughout the present invention, "multidimensional" refers to 3 or higher dimensions.

The present invention provides: (1) a method of designing an FPGA is characterized in that it comprises embedding an n-dimensional FPGA switch topology in an m-dimensional integrated circuit, where m and n are both natural numbers and m<n; (2) the method of (1), wherein m=2 and n=3 or 4; (3) a semiconductor integrated circuit, comprising an FPGA including an n-dimensional FPGA switch topology embedded in an m-dimensional integrated circuit; (4) the semiconductor integrated circuit of (3), wherein m=2 and n=3; (5) the semiconductor integrated circuit of (3), wherein m=2 and n=4; (6) the semiconductor integrated circuit of (3), wherein in the FPGA, wire channels in axial directions associated with the m dimensions include wires of various lengths; (7) the semiconductor integrated circuit of (3), wherein in the FPGA, wire channels in axial directions associated with the m dimensions include wires of full length; (8) the semiconductor integrated circuit of (3), wherein in the FPGA, closely located wire channels in axial directions associated with the m dimensions have ends connected to one another; (9) the semiconductor integrated circuit of (3), wherein in the FPGA, each basic block has a hierarchical structure; (10) the semiconductor integrated circuit of (4), wherein in the FPGA: basic blocks located at the same x-y position are constructed 2-dimensionally as a single subregion; connections are made in a z-direction; the subregions are arranged in a 2-dimensional array; connections are made in an x-direction between basic blocks located at the same z position in subregions adjoining in a lateral direction; and connections are made in a y-direction between basic blocks located at the same z position in subregions adjoining in a longitudinal direction; (11) the semiconductor integrated circuit of (5), wherein in the FPGA: basic blocks located at the same u-v position are constructed in a 2-dimensional array as a single subregion; connections are made in an x-direction between basic blocks adjoining in a lateral direction; connections are made in a y-direction between basic blocks adjoining in a longitudinal direction; the subregions are arranged in a 2-dimensional array; connections are made in a u-direction between basic blocks located at the same x-y position in subregions adjoining in the lateral direction; and connections are made in a v-direction between basic blocks located at the same x-y position in subregions adjoining in the longitudinal direction; (12) the semiconductor integrated circuit of (10), wherein in each subregion in the FPGA, wire channels in the z-direction each have a lower end and an upper end connected to each other; (13) the semiconductor integrated circuit of (10), wherein in the FPGA, the subregions are arranged 2-dimensionally so that basic blocks adjoining in the z-direction adjoin each other; (14) the semiconductor integrated circuit of (11), wherein in the FPGA, wire channels in the y-direction in a first subregion each have a lower end connected to an upper end of one of wire channels in the y-direction in a second subregion which is immediately below the first subregion; (15) the semiconductor integrated circuit of (11), wherein in the FPGA, wire channels in the x-direction in a first subregion each have a right hand end connected to a left hand end of one of wire channels in the x-direction in a second subregion which is immediately to the right of the first subregion; (16) the semiconductor integrated circuit of (13), wherein in the FPGA, the subregions are constructed by arranging the basic blocks linearly in the longitudinal direction; (17) the semiconductor integrated circuit of (13), wherein in the FPGA, the subregions are constructed by folding a z-axis at least once to arrange the basic blocks; and (18) the semiconductor integrated circuit of (16), wherein in the FPGA, wire channels in the z-direction in a first subregion each have a lower end connected to an upper end of one of wire channels in the z-direction in a second subregion which is immediately below the first subregion.

The present invention does not limit the structure of logic blocks, connections between the logic blocks and switch matrices in any particular manner. In addition, the logic blocks may be replaced with blocks which include functional units, such as memory and a multipliers, without departing from the scope of the present invention.

An n-dimensional FPGA (only theoretical where $n \geq 4$) contains basic blocks, aligned in axial directions associated with the n dimensions like an array, which are connected by wires running like a n-dimensional lattice.

In an FPGA with an n-dimensional FPGA switch topology, switch matrices in the basic blocks of the FPGA are connected to wire channels in the positive and negative directions for each axis, that is, a total of 2n directions. Switches are disposed to convey signals from at least one wire track of a wire channel in the first direction to at least one associated wire track of a wire channel in all the 2n−1 directions other than the first direction.

In the present invention, the direction representing terms, lateral and longitudinal, are exchangeable. The axis representing terms, x, y, u, v, z, etc, are also exchangeable.

The present invention is characterized by embedding an FPGA which has a relatively high dimensional switch topology in a relatively low dimensional chip. This feature mitigates the problems that a greater scale FPGA contains more switch stages connecting between logic blocks and more switches in the FPGA, thus greatly improving performance. Especially when the FPGA is embedded in a 2-dimensional chip structure, high integration FPGAs can be manufactured easily at high yields and economical manufacturing cost. The wiring process with which the wiring architecture of the present invention is produced is an ordinary, traditional 2-dimensional chip process. Being 2-dimensional, the structure shows similar heat radiation as the 2-dimensional FPGA. There is no worry about negative impact of heat buildup in a 3-dimensional structure. It is also possible in the present invention to embed an FPGA which has a 4- or higher dimensional switch topology in a 2-dimensional chip and in an actual 3-dimensional chip processed with 3-dimensional integration technology. Advances in 3-dimensional integration technology could lead to 3-dimensional FPGAs with sufficient integration. However, embedding a 4- or higher dimensional switch topology in a 3-dimensional chip would still be effective in successfully manufacturing ultra high integration FPGA.

It is the switches, not metal wires, that most affect the integration of logic and operating speed of the FPGA. Thus, embedding a 3-dimensional FPGA switch topology in a 2-dimensional chip delivers such advantages of the 3-dimensional FPGA that fewer switch stages exist between logic blocks and the FPGA needs fewer switches.

To realize an even greater scale FPGA, an FPGA with a 4- or higher dimensional switch topology would be presumably more advantageous. The present invention encompasses FPGAs with a 4- or higher dimensional switch topology.

The present invention solves the problem of increasing wiring area of large scale FPGAs and makes it possible to realize an FPGA with one hundred million or more gates. The invention also opens up a new, wide variety of applications for the FPGA in network/communications fields, such as routers, SANs, and blade servers, in video fields, such as medical/industrial imaging devices, and to digital household appliances and mobile digital devices, such as DVD-RW players and LCD TVs. FPGA market will grow.

The following will describe the workings of the present invention in detail. In the 3-dimensional FPGA, the number of transistors in switch matrices decreases, which in turn greatly improves logic density. This is due to an excellent 3-dimensional FPGA switch topology, not 3-dimensional integrated circuit technology. Therefore, embedding a 3-dimensional FPGA switch topology in a 2-dimensional chip reduces the number of transistors in switch matrices similarly to the 3-dimensional FPGA. The embedding of a 3-dimensional FPGA switch topology in a 2-dimensional chip also transforms all vertical wires into those running horizontally, which increases metal wire density. Usually, in the FPGA, the metal wire density has a much larger growth margin than the transistor density. Also, metal wires are provided in multiple layers, and the number of layers will increase further. This will further lowers metal wire density. Therefore, multilayer wires cannot be effectively used with a general 2-dimensional FPGA. Multilayer wires can be used effectively with the present invention.

The present invention, unlike the 3-dimensional FPGA which requires 3-dimensional integrated circuit technology, utilizes conventional integrated circuit technology. It does not raise any manufacturing problems.

The present invention, if implemented in a 2-dimensional chip as an useful embodiment, achieves good heat radiation.

The 3-dimensional FPGA shows increasingly high performance with higher integration, when compared to the 2-dimensional FPGA. Embedding a 4- or higher dimensional FPGA switch topology in 2 dimensions is effective with even higher integration FPGAs.

(19) A programmable device of the present invention is a programmable device, comprising: basic blocks; and switching elements provided to the basic blocks, the basic blocks being connected to one another via the associated switching elements, wherein: at least some of the basic blocks are arranged in a matrix and constitute basic block matrices in which those particular basic blocks are sequentially connected in rows and columns; basic blocks located at corresponding matrix positions in the basic block matrices are connected to one another; and the basic block matrices are arranged in a plane.

The programmable device is a circuit, like the FPGA, of which the logic functions are freely reconfigurable. The device encompasses FPGA-like circuits in which logic blocks are replaced with adders, multipliers, or memory. The basic block is a basic unit in the programmable device and contains a switch matrix, functional circuitry, a bunch of wires which connect the switch matrix to the functional circuitry, and a bunch of wires which connect the switch matrix to the switch matrices in other basic blocks.

The switch matrix includes a plurality of switches with functions to connect/disconnect wires (signal paths) of the switch matrix. Each switch is set to connect or disconnect based on a memory element or a built-in memory function of the switch.

The functional circuitry is circuitry which performs a predetermined computing function. The functional circuitry encompasses a logic block, an adder, a multiplier, memory, etc. The functional circuitry may allow settings to be made on it to perform a function based on a memory element or a built-in memory function of the functional circuitry. The functional circuitry may have a hierarchical structure in which an upper-level basic block includes lower-level basic blocks.

The bunch of wires is a set of wires which convey signals.

In the configuration above, at least some of the basic blocks in the programmable device are arranged in a matrix and constitute basic block matrices in which those particular basic blocks are sequentially connected in rows and columns. Therefore, the basic block matrices can perform functions corresponding to those performed by the basic blocks in a conventional 2-dimensional FPGA which are arranged in a 2-dimensional array.

In addition, in the configuration above, basic blocks located at corresponding matrix positions in the basic block matrices are connected to one another. Accordingly, in the configuration above, connections between basic blocks involve fewer switch matrices, like a conventional 3-dimensional FPGA, when compared to a conventional 2-dimensional FPGA, which in turn improves logic density.

Furthermore, in the configuration above, the basic block matrices are arranged in a plane. Accordingly, in the configuration above, it is no longer necessary to form fine vertically running wires which are difficult to fabricate. The configuration is easier to manufacture and better addresses the heat radiation problems than conventional 3-dimensional FPGAs.

As described in the foregoing, the configuration above solves the problems of conventional 2- and 3-dimensional FPGAs.

(20) Another programmable device of the present invention is the programmable device of (19), wherein those basic blocks which constitute the basic block matrices may be located together in a predetermined area.

(21) Another programmable device of the present invention is the programmable device of (19), wherein basic blocks located at corresponding matrix positions in the basic block matrices may be located together in a predetermined area.

(22) Another programmable device of the present invention is the programmable device of (19), wherein basic blocks located at corresponding matrix positions in the basic block matrices may be connected 1-dimensionally to each other.

In the configuration above, in addition to the 2-dimensional connections in each basic block matrix, those basic blocks which are located at corresponding matrix positions in the basic block matrices are connected 1-dimensionally to each other. The basic blocks are thus connected together in three dimensions.

(23) Another programmable device of the present invention is the programmable device of (19), wherein basic blocks located at corresponding matrix positions in the basic block matrices may be connected 2-dimensionally to one another.

In the configuration above, in addition to the 2-dimensional connections in each basic block matrix, those basic blocks which are located at corresponding matrix positions in the basic block matrices are connected 2-dimensionally to one another. The basic blocks are thus connected together in four dimensions.

BRIEF DESCRIPTION OF DRAWINGS

FIG. 4 shows an FPGA being formed by arranging basic blocks.

FIG. 5 is a plan view of a basic block in a 3-dimensional FPGA.

FIG. 12 shows connections between basic blocks in an FPGA example in which a 4-dimensional FPGA is embedded in a 2-dimensional chip in each x, y-plane.

FIG. 14 shows a part of the FPGA in FIG. 12, with the x- and y-axes being connected together at their ends between adjoining x, y-planes.

BEST MODE FOR CARRYING OUT THE INVENTION

Figure 1A:
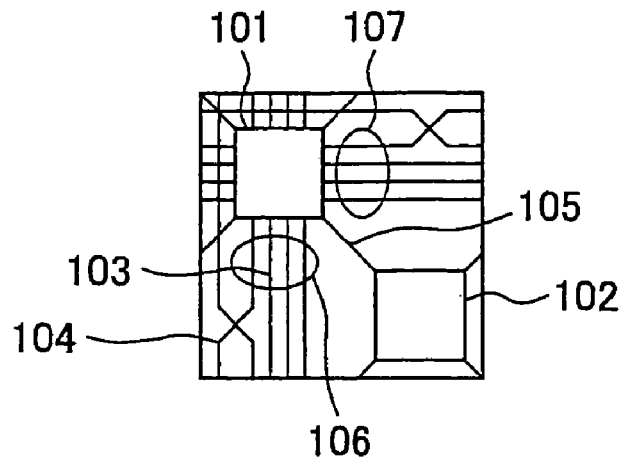
FIG. 1a is a plan view illustrating an FPGA basic block.

The following will describe embodiments of the present invention in reference to figures. The invention is by no means limited to these concrete examples.

In the following description, those members which have the same or similar functions as those of the 3-dimensional FPGA explained in BACKGROUND ART in reference to FIGS. 5, 6a, 6b, and 7 will be indicated at the same reference numerals. Their description will be omitted. Members newly introduced in the following which have the same or similar functions with each other will be indicated at the same reference numerals. Their description will not be repeated.

3-Dimensional FPGA Embedded in 2-Dimensional Chip (1)

Figure 8:
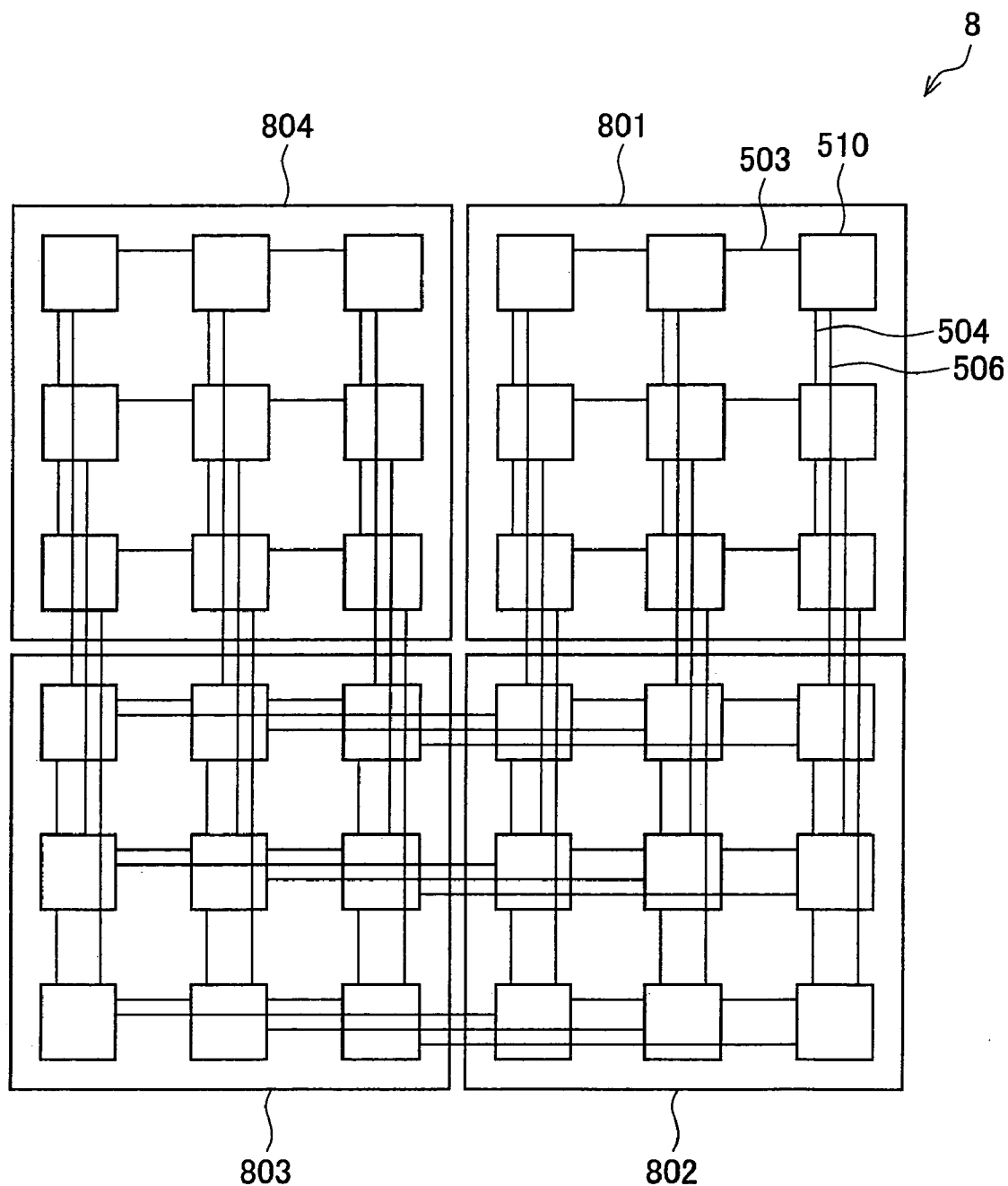
FIG. 8 shows an FPGA in which a 3-dimensional FPGA is embedded in a 2-dimensional chip in each layer.

FIG. 8 shows an FPGA 8 in which a 3-dimensional FPGA (3 rows×3 columns×4 layers) is embedded in a 2-dimensional chip. The FPGA 8 contains first to fourth layers 801 to 804 being arranged clockwise in two dimensions. The layers 801 to 804 have congruent rectangular areas. The first to fourth layers 801 to 804 in the FPGA 8 in FIG. 8 are arranged in two dimensions; they are actually not arranged in layers. For convenience in description, however, the members are termed "layers." Wire channels 506, providing interlayer connections, connect basic blocks at the same positions (i.e., in the same row and in the same column) in adjoining layers (specifically, the first layer 801 and the second layer 802, the second layer 802 and the third layer 803, and the third layer 803 and the fourth layer 804). The same 2-dimensional, planar arrangement is applicable also to more layers. In those cases, the layers are preferably folded to reduce the chip's aspect ratio. In addition, the first layer 801 and the fourth layer 804 provide the ends of vertical wire channels in the 3-dimensional FPGA according to the embedding method in FIG. 8. The first layer 801 and the fourth layer 804 can however be readily connected to each other since they are adjacent to each other in the FPGA 8.

Each basic block 510 of the FPGA 8 includes, as does the basic block shown in FIG. 5, a switch matrix 501, a logic block 502 (reconfigurable logic element and memory), a wire 505 connecting the switch matrix 501 to the logic block 502, and wire channels 503, 504, 506. In the FPGA 8, the wire channels 506 extend horizontally in the chip since they are for connections between the first layer 801 to the fourth layer 804 arranged in two dimensions.

Figure 9:
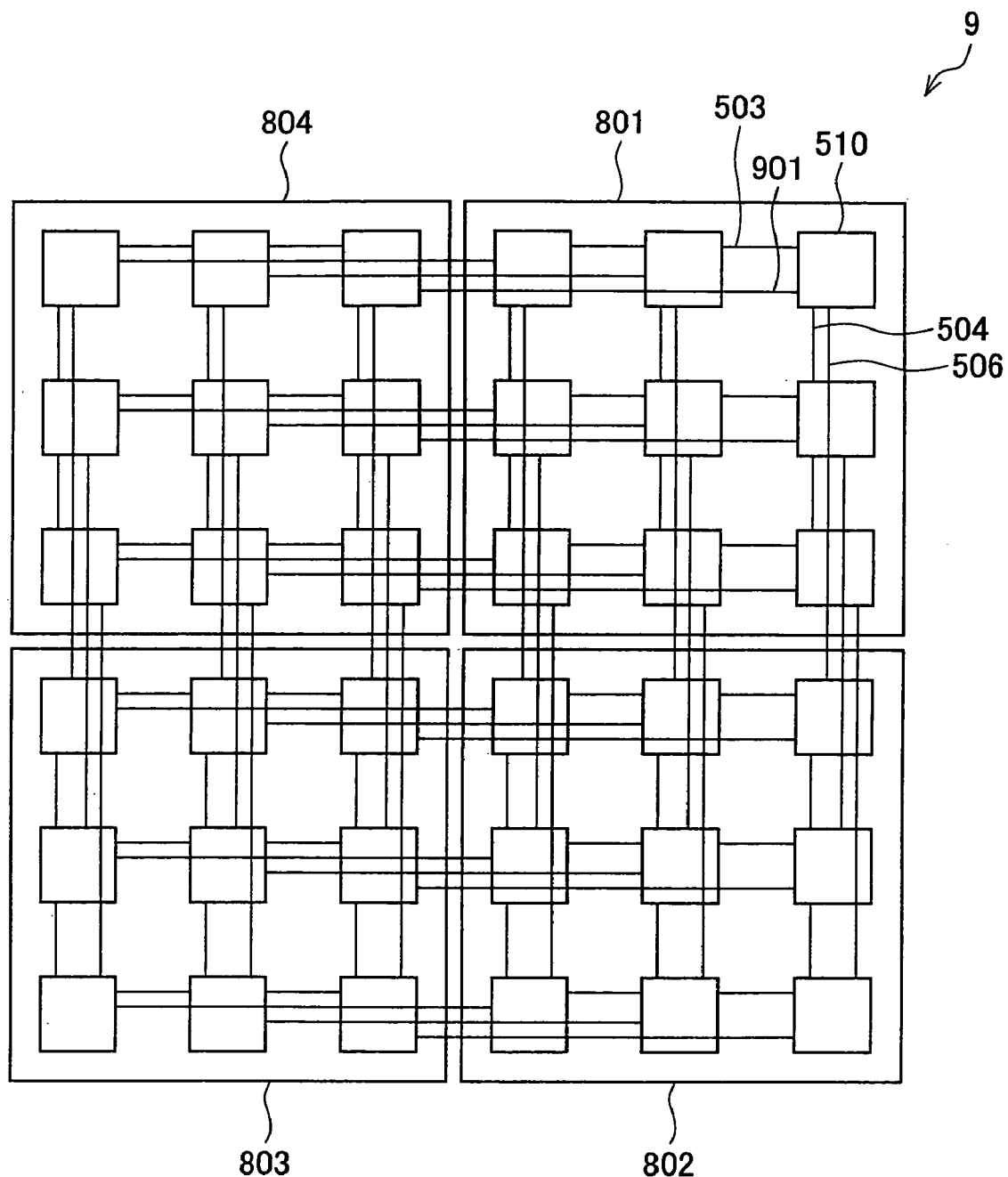
FIG. 9 shows an FPGA in which a 3-dimensional FPGA is embedded in a 2-dimensional chip in each layer with wires in the z-direction being connected together at their ends.

FIG. 9 shows an FPGA 9 which has the same configuration as the FPGA 8 in which a 3-dimensional FPGA (3 rows×3 columns×4 layers) is embedded in a 2-dimensional chip and which additionally includes wire channels 901 connected the first layer 801 to the fourth layer 804 so that vertically running wires can make a loop. The configuration makes efficient use of the wiring area on the chip than the configuration in FIG. 8.

As described in the foregoing, the basic blocks are arranged in matrices in the FPGAs 8, 9 to provide the first to fourth layers ("basic block matrices") 801 to 804 sequentially connected in rows and columns. Therefore, each basic block matrix can perform functions corresponding to those performed by the basic blocks arranged in a 2-dimensional array in a conventional 2-dimensional FPGA.

Basic blocks located at corresponding matrix positions (in the same row and in the same column) in the basic block matrices are connected to one another. Accordingly, in the FPGAs 8, 9, connections between the basic blocks involve fewer switch matrices, like a conventional 3-dimensional FPGA, when compared to a conventional 2-dimensional FPGA, which in turn improves logic density.

Furthermore, the basic block matrices are arranged in a plane. Accordingly, in the FPGAs 8, 9, it is no longer necessary to form vertically running fine wires which are difficult to fabricate. The configuration is easier to manufacture and better addresses the heat radiation problems than conventional 3-dimensional FPGAs.

As described in the foregoing, the configurations in the FPGAs 8, 9 solve the problems of conventional 2- and 3-dimensional FPGAs.

In the FPGAs 8, 9, the basic blocks in the basic block matrices are located together in predetermined areas (first to fourth layers 801 to 804).

Furthermore, in the FPGAs 8, 9, the basic blocks located at corresponding matrix positions in the basic block matrices are connected 1-dimensionally to each other. In the configuration, the 1-dimensional connections, added to the 2-dimensional connections in the basic block matrices, provide 3-dimensional connections between the basic blocks.

3-Dimensional FPGA Embedded in 2-Dimensional Chip (2)

Figure 10:
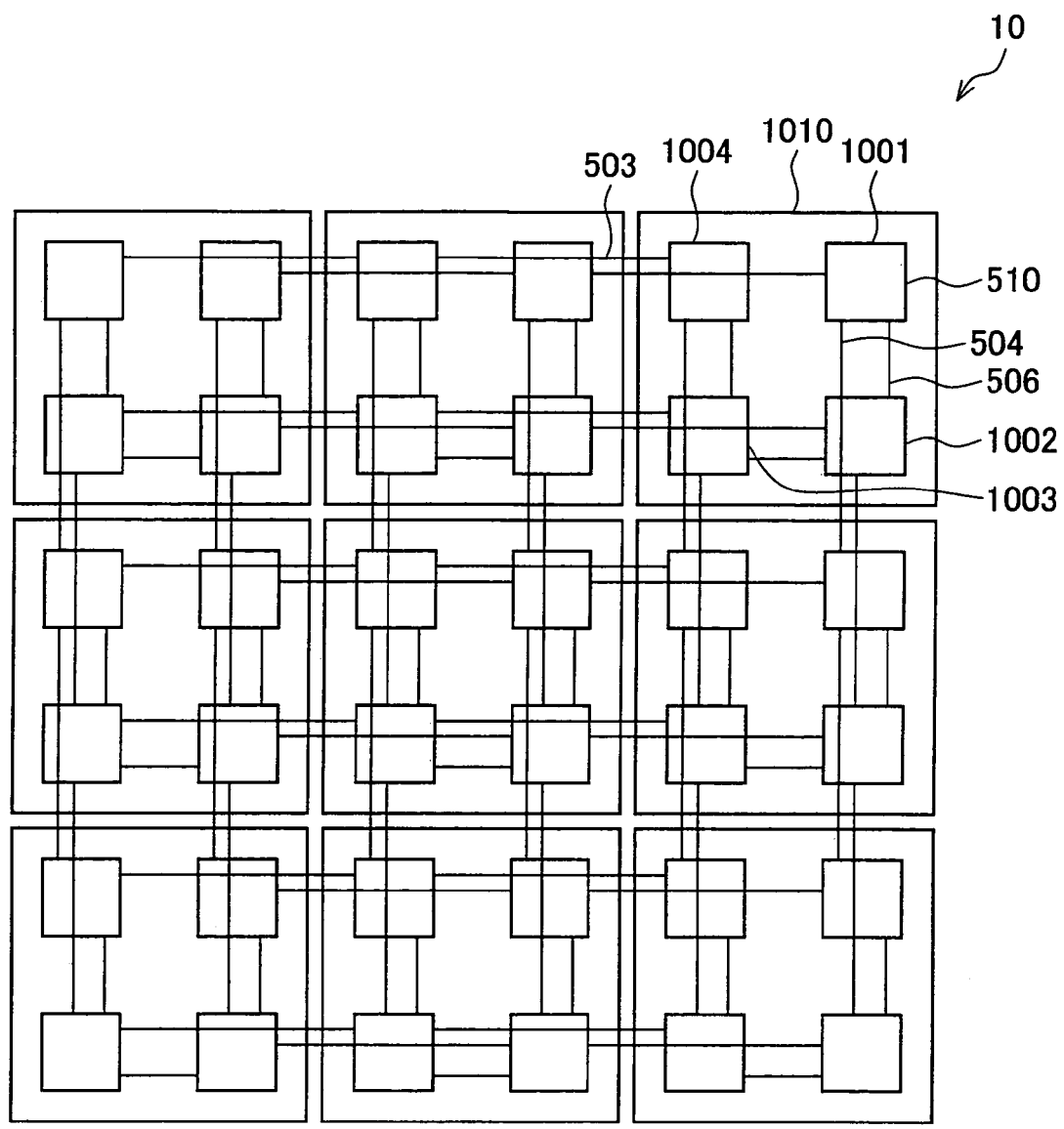
FIG. 10 shows an FPGA in which a 3-dimensional FPGA is embedded in a 2-dimensional chip in each basic block adjoining in the z-axis direction.

FIG. 10 shows an FPGA 10 in which, unlike the examples of the FPGA 8 in FIG. 8 and the FPGA 9 in FIG. 9 in which each layer of the FPGA is individually embedded, basic blocks at the same positions (i.e., in the same row and in the same column) in the layers are arranged and embedded in one area and in a 2-dimensional array. In the FPGA 10, for example, the area 1010 represents basic blocks located on the upper right corners of the layers. In other words, the basic blocks 1001 to 1004 are equivalent to the basic blocks 510 (located on the upper right corners of the first layer 801 to the fourth layer 804 in the FPGA 8 in FIG. 8) which are arranged clockwise in two dimensions in the area 1010 and includes wire channels 506 connecting adjacent layers to each other. When more layers are involved, the basic blocks in the area 1010 are folded to reduce the chip's aspect ratio.

Figure 11:
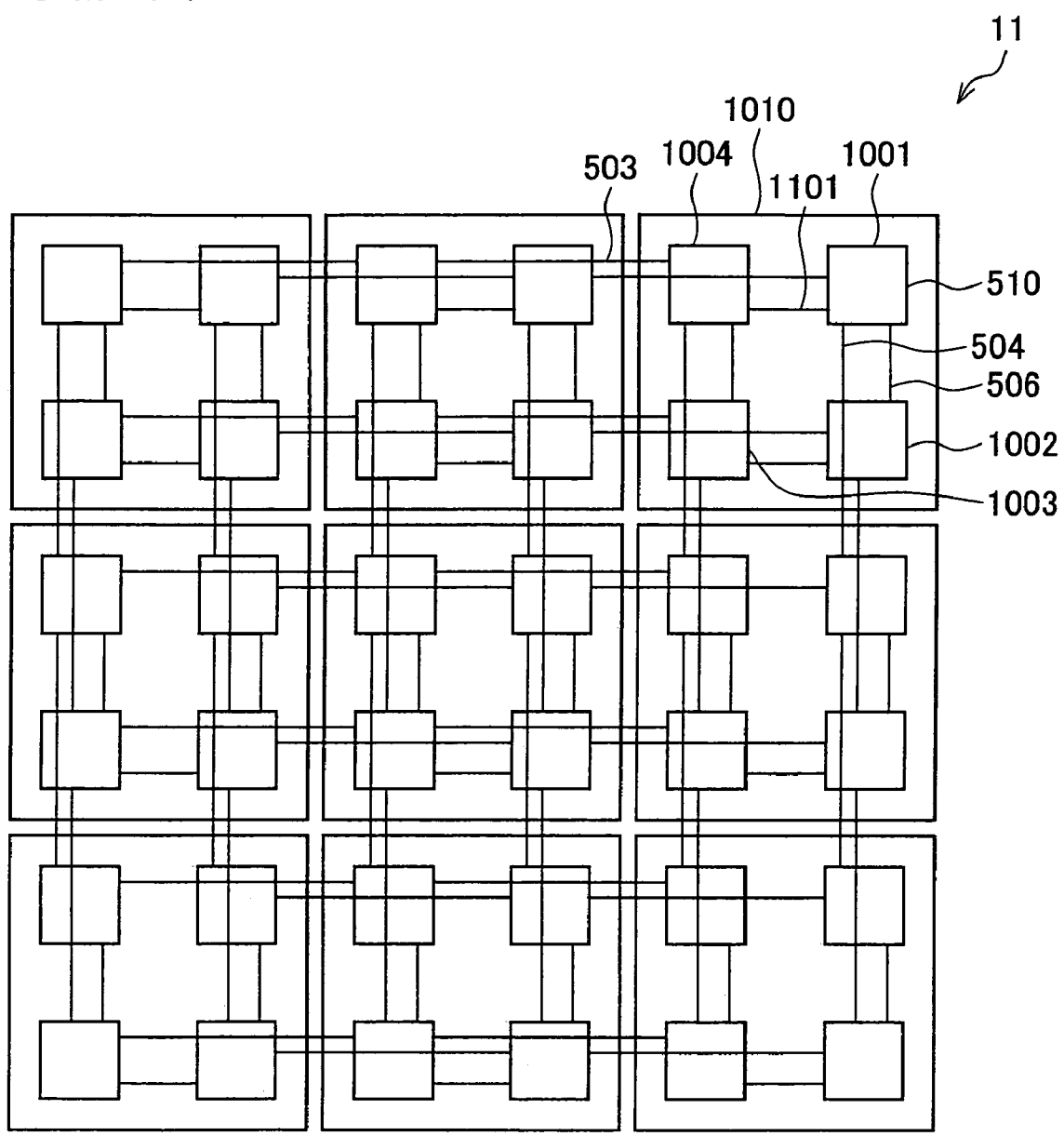
FIG. 11 shows an FPGA in which a 3-dimensional FPGA is embedded in a 2-dimensional chip in each basic block adjoining in the z-axis direction with wires in the z-direction being connected together at their ends.

FIG. 11 shows an FPGA 11 in which, similarly to the embedding in FIG. 9, a wire channel 1101 connects the basic block 1001 to the basic block 1004 so that the vertically running wire channels can form a loop. This configuration makes more efficient use of the wiring area on the chip than the configuration in FIG. 10.

The embedding methods in FIG. 10 and FIG. 11 have an advantage over those in FIG. 8 and FIG. 9 that wire density does not increase much. The advantage addresses the problem of increasing chip area due to provision of wires.

As described in the foregoing, in the FPGAs 10, 11, for example, the upper right basic block in the area 1010 and the upper right basic blocks in other areas are arranged in a matrix and sequentially connected in rows and columns. This is true with the basic blocks at the lower right, the upper left, and the lower left in any area. Referring to each set of basic blocks arranged in a matrix and sequentially connected in rows and columns in this manner as a basic block matrix, each basic block matrix can perform functions corresponding to those performed by the basic blocks arranged in a 2-dimensional array in a conventional 2-dimensional FPGA.

Basic blocks located at corresponding matrix positions (in the same row and in the same column) in the basic block matrices are connected to one another. Accordingly, in the FPGAs 10, 11, connections between the basic blocks involve fewer switch matrices, like a conventional 3-dimensional FPGA, when compared to a conventional 2-dimensional FPGA, which in turn improves logic density.

Furthermore, the basic block matrices are arranged in a plane. Accordingly, in the FPGAs 10, 11, it is no longer necessary to form vertically running fine wires which are difficult to fabricate. The configuration is easier to manufactured and better addresses the heat radiation problems than conventional 3-dimensional FPGAs.

As described in the foregoing, the configurations in the FPGAs 10, 11 solve the problems of conventional 2- and 3-dimensional FPGAs.

Furthermore, in the FPGAs 10, 11, the basic blocks located corresponding matrix positions in the basic block matrices are located together in a predetermined area (for example, area 1010).

In addition, in the FPGAs 10, 11, the basic blocks located at corresponding matrix positions in the basic block matrices are connected 1-dimensionally to each other. In the configuration, the 1-dimensional connections, added to the 2-dimensional connections in the basic block matrices, provide 3-dimensional connections between the basic blocks.

3-Dimensional FPGA Embedded in 2-Dimensional Chip (3)

Figure 15:
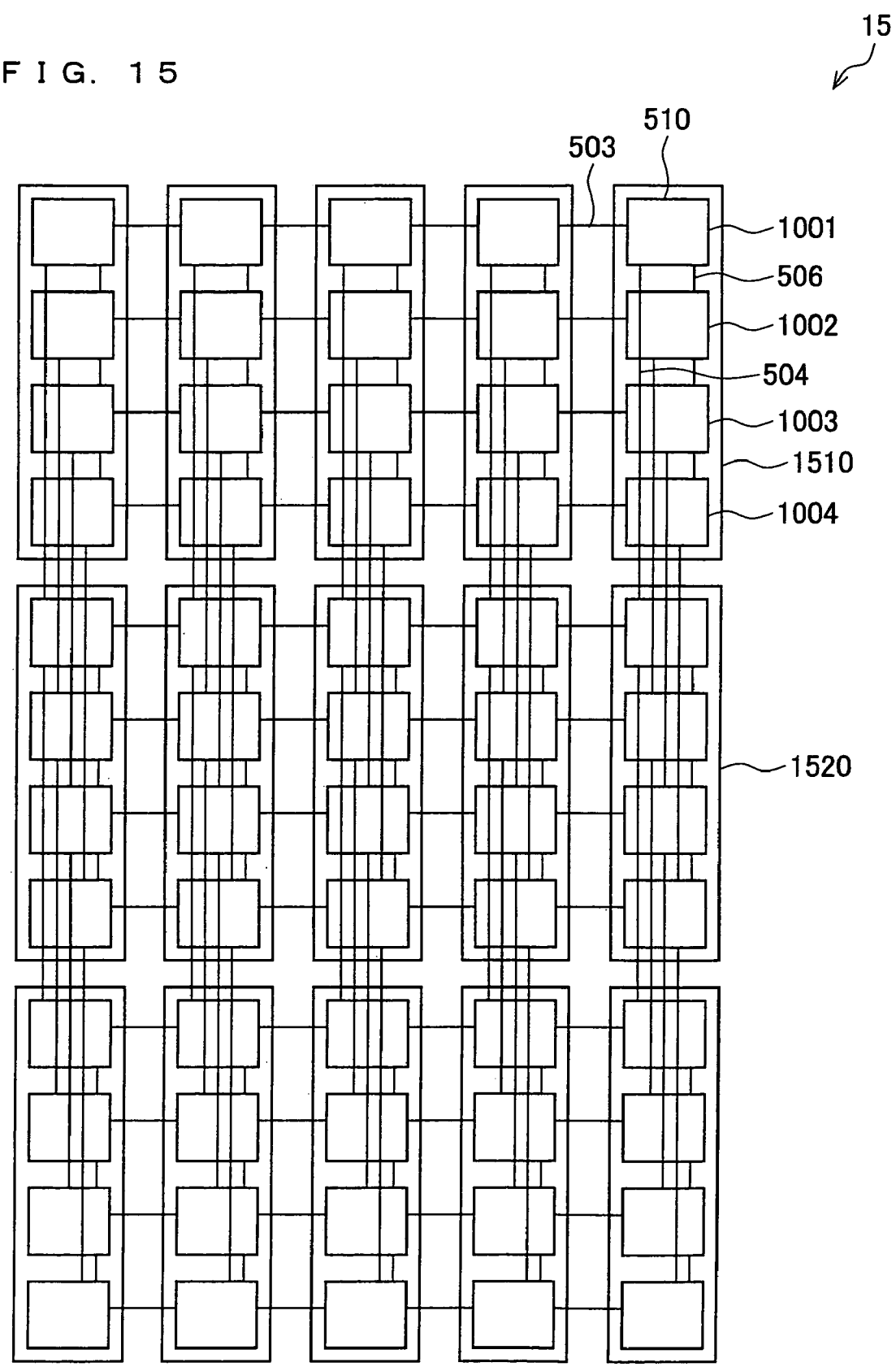
FIG. 15 shows an FPGA in which a 3-dimensional FPGA is embedded in a 2-dimensional chip by arranging basic blocks adjoining in the z-axis direction in the longitudinal direction.

FIG. 15 shows an FPGA 15 in which a 3-dimensional FPGA (3 rows×5 columns×4 layers) is embedded in a 2-dimensional chip. Similarly to the FPGA 10 in FIG. 10, the basic blocks at the same positions in the layers are arranged in one area. Unlike the FPGA 10, however, the basic blocks 1001 to 1004 in the FPGA 15, which are located at the same positions in the layers, are arranged linearly in the longitudinal direction in the area (z-plane) 1510. The configuration increases the aspect ratio and lowers packaging efficiency; it is however possible to lower the aspect ratio by reducing the number of rows and layers.

Figure 16:
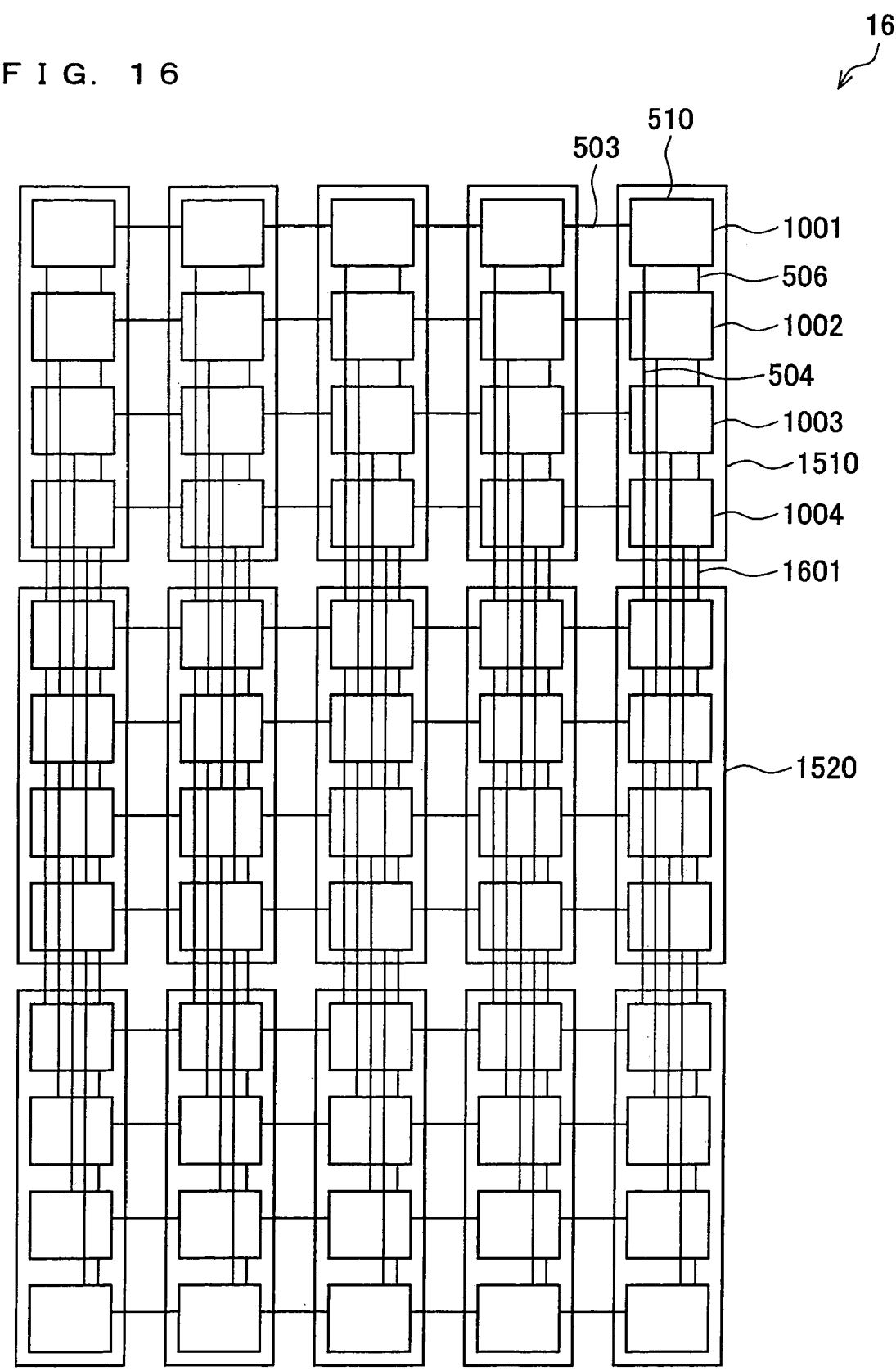
FIG. 16 shows an FPGA in which a 3-dimensional FPGA is embedded in a 2-dimensional chip by arranging basic blocks adjoining in the z-axis direction in the longitudinal direction.

FIG. 16 shows an FPGA 16 which has the same basic configuration as the FPGA 15 in FIG. 15 and includes wire channels 1601 connecting an area 1510 to another area 1520. The configuration makes more efficient use of the wiring area on the chip than the configuration in FIG. 15.

As described in the foregoing, in the FPGAs 15, 16, for example, the top basic block in the area 1510 and the top basic block in other areas are arranged in a matrix and sequentially connected in rows and columns. This is true with the second top, the third top, and the bottom basic blocks in any area. Referring to each set of basic blocks arranged in a matrix and sequentially connected in rows and columns as a basic block matrix, each basic block matrix can perform functions corresponding to those performed by the basic blocks arranged in a 2-dimensional array in a conventional 2-dimensional FPGA.

Basic blocks located at corresponding matrix positions (in the same row and in the same column) in the basic block matrices are connected to one another. Accordingly, in the FPGAs 15, 16, connections between the basic blocks involve fewer switch matrices, like a conventional 3-dimensional FPGA, when compared to a conventional 2-dimensional FPGA, which in turn improves logic density.

Furthermore, the basic block matrices are arranged in a plane. Accordingly, in the FPGAs 15, 16, it is no longer necessary to form vertically running fine wires which are difficult to fabricate. The configuration is easier to manufacture and better addresses the heat radiation problems than conventional 3-dimensional FPGAs.

As described in the foregoing, the configurations in the FPGAs 15, 16 solve the problems of conventional 2- and 3-dimensional FPGAs.

Furthermore, in the FPGAs 15, 16, the basic blocks located at corresponding matrix positions in the basic block matrices are located together in a predetermined area (for example, area 1510).

In addition, in the FPGAs 15, 16, the basic blocks located at corresponding matrix positions in the basic block matrices are connected 1-dimensionally to each other. In the configuration, the 1-dimensional connections, added to the 2-dimensional connections in the basic block matrices, provide 3-dimensional connections between the basic blocks.

4-Dimensional FPGA Embedded in 2-Dimensional Chip

FIG. 12 shows an FPGA 12 in which a 4-dimensional switch topology is embedded in a 2-dimensional chip. The FPGA 12 is made up of basic blocks 1205 which contains a 4-dimensional topology switch matrix (see FIG. 13; details will be given later). In the following, the four axes corresponding to the four dimensions are indicated by x, y, u, and v. The FPGA 12 in FIG. 12 is made up of 4×4×3×3 (in the order of x, y, u, v)=144 basic blocks. The wire channel 1201 extends in the y-direction, the wire channel 1202 in the x-direction, the wire channel 1203 in the v-direction, and the wire channel 1204 in the u-direction. FIG. 12 shows wire channels only for one switch matrix; wire channels are similarly provided for the other switch matrices too. The wire channels 1201, 1202 running in the x, y-axis directions connect the switch matrices in the x, y-plane (area) 1206. The x, y-planes are arranged like 2-dimensional planes to form a u, v-plane. Adjoining x, y-planes in a u, v-plane are connected together by the wire channels 1203, 1204 running in the u-, v-axis directions. The wire channels 1203, 1204 connect switch matrices at the same x-y positions in two x, y-planes (in other words, in the same row and in the same column) to each other.

Figure 13:
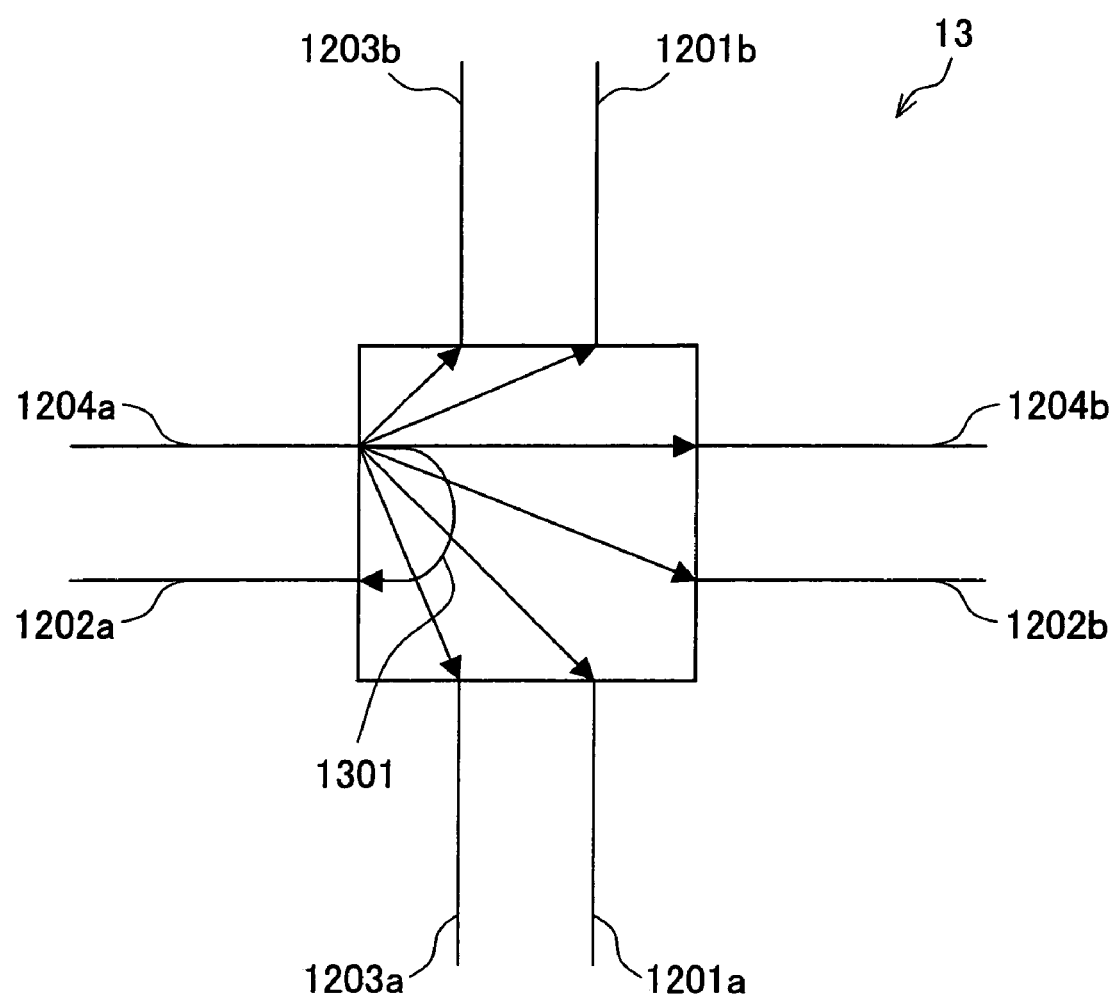
FIG. 13 is a schematic showing a topology of a 4-dimensional switch matrix.

FIG. 13 shows a topology for a 4-dimensional switch matrix 13. FIG. 13 shows connections from the wire channel 1204*a*, that is, from the left hand side of the wire channel along the u-axis direction to the wire channels 1201*a*, 1201*b*, 1202*a*, 1202*b*, 1203*a*, 1203*b*, and 1204*b* in different axial directions. The arrows indicate directions in which connections are made. Connections to the axial directions indicated by the arrows exist. The figure shows only connections as viewed from one direction; there exist, however, similar connections, from no matter whichever side of the other axes the topology is viewed. The 4-dimensional switch matrix 13 contains switches connecting wire channels running in 7 directions as above. This leads to increases of switches per track when compared to 2- and 3-dimensional switch matrices. However, in an ultra large scale FPGA, the increase of the wire channel tracks falls, and the number of transistors drops as a result.

In FIG. 9 and FIG. 11, the wire channels in the z-direction are connected to each other at their ends to form a loop. Apart from that, in FIG. 12, the ends of the wire channels in the x, y-directions can be connected to each other at the interface of the x, y-planes which are adjacent to each other in a u, v-plane. FIG. 14 shows the interface of the x, y-plane 1206 and the wire channels in the x, y-directions. The wire channels 1401 connect the ends of the wire channels in the x, y-directions to each other. Regardless of embedding methods, if the wire channels in axial directions associated with the m dimensions have ends close to each other, switches do not increase as much by connecting them. This improves flexible in wiring.

As described in the foregoing, in the FPGA 12, basic blocks are arranged and sequentially connected in rows and columns in a matrix in, for example, the area 1206. Further, the FPGA 12 includes areas which have the same configuration as the area 1206 that are arranged in a 3×3 matrix. Referring to each of the areas as a basic block matrix, each basic block matrix can perform functions corresponding to those performed by the basic blocks arranged in a 2-dimensional array in a conventional 2-dimensional FPGA.

Basic blocks located at corresponding matrix positions (in the same row and in the same column) in the basic block matrices are connected to one another. Accordingly, in the FPGA 12, connections between the basic blocks involve fewer switch matrices, like a conventional 3-dimensional FPGA, when compared to a conventional 2-dimensional FPGA, which in turn improves logic density.

Furthermore, the basic block matrices are arranged in a plane. Accordingly, in the FPGA 12, it is no longer necessary to form vertically running fine wires which are difficult to fabricate. The configuration is easier to manufacture and better addresses the heat radiation problems than conventional 3-dimensional FPGAs.

As described in the foregoing, the configuration in the FPGA 12 solves the problems of conventional 2- and 3-dimensional FPGAs.

Furthermore, in the FPGA 12, the basic blocks in the basic block matrices are located together in a predetermined area (for example, area 1206).

In addition, in the FPGA 12, the basic blocks located at corresponding matrix positions in the basic block matrices are connected 2-dimensionally in the u, v-directions to each other. In the configuration, the 2-dimensional connections in the u, v-directions, added to the 2-dimensional connections in the x, y-directions in each of the basic block matrices, provide 4-dimensional connections between the basic blocks.

Comparison to Comparative Configuration

It is also effective to provide wires of various lengths in wire channels in the different axial directions and to provide a hierarchical structure taught in patent documents 6, 7, 11, 4, 10 in each basic block as is the case with general FPGAs.

These structures in which a 3- or 4-dimensional switch topology is embedded in two dimensions, if divided into subregions and superregions, can be considered as a hierarchical structure similarly to those in patent documents 6, 7, 11, 4, 10. FIGS. 8, 9, and 12 show hierarchical structures if the basic blocks arranged in the x, y-plane directions are considered as subregions (the basic blocks arranged in the first to fourth layers 801 to 804 in FIGS. 8 and 9, and those arranged in the areas 1206 in FIG. 12). FIGS. 10, 11, 15, and 16 show hierarchical structures if the basic blocks arranged in the z-axis direction are considered as subregions (the basic blocks arranged in the areas 1010 in FIG. 10 and FIG. 11, and those arranged in the areas 1510 in FIGS. 15 and 16). The following will describe the uniqueness of the present invention from the perspective of hierarchical structure.

In patent documents 6, 7, 11, all logic elements are equivalently connected, including connections between logic elements in subregions and those from each logic element to a wire channel in a superregion. A mapping tool does not have to consider the layout of a logic element in a subregion and can be simplified. This is an advantage of those patent documents. However, the number of switches increases rapidly with the size of the subregion.

In patent documents 4, 10, there is a 2-dimensional array in the subregion. At a first look, the structure may resemble the one in FIG. 12. However, the wire channels of a superregion exist like a lattice in gaps between subregions. Connections from a subregion to a wire channel of a superregion is limited to the periphery of the subregion. The structure needs many switches to connect subregions to superregions. This is again not suitable for the configuration of large scale subregions. In addition, since multilayer wires are now being used, there is no advantage in limiting the superregion wires to the periphery of a subregion in this manner.

In the structure of the present invention, each logic element (basic block) in a subregion has a switch matrix which doubles as a switch matrix for a superregion. In a subregion, there are connections only between switch matrices of logic elements adjacent to each other in different axial directions. The wire channels of a superregion are adapted to connect between the switch matrices of logic elements located at the same position in each subregion. Since the subregions are more tightly coupled, the number of switches does not increase much even if the subregion size grows.

Embedding methods in which subregions and superregions cannot be deliberately separable are also possible.

Arrangement of Layout Tile

Embedding an FPGA with a 5- or higher dimensional topology to two dimensions is readily realized using 3- or 4-dimensional embedding.

Embedding a topology with odd-numbered dimensions in a 2-dimensional chip is difficult in determining a layout. For example, in an example where a 3-dimensional topology is embedded into a 2-dimensional chip, the embedding is readily realized by repeatedly arranging identical tiles by the embedding methods in FIGS. 15 and 16. The embedding is rather difficult with the embedding method in FIGS. 8 and 9 and the method in FIGS. 10 and 11.

A tile or layout tile refers to a unit rectangular area constituting an array. The tile or layout tile is a circuit, making up a basic block, which is arranged in a 2-dimensional rectangular area.

Figure 17A:
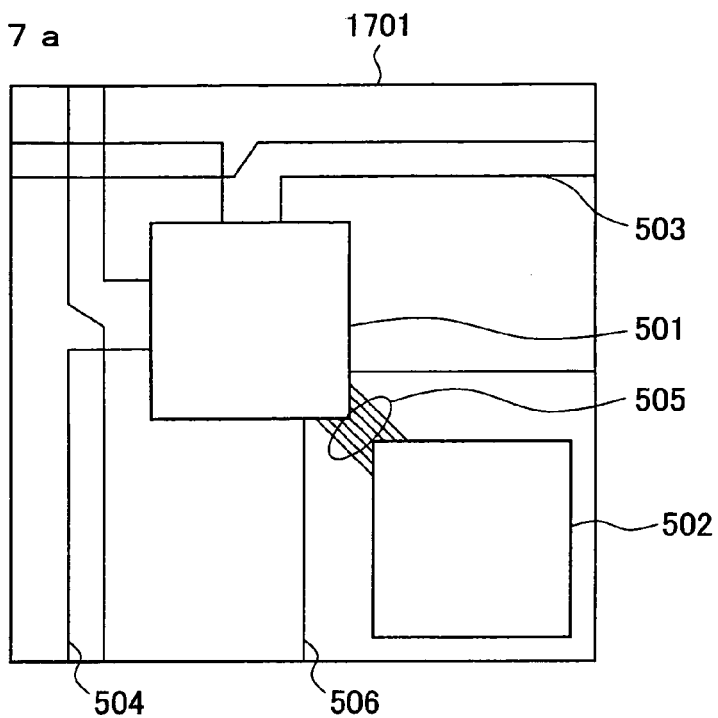
FIG. 17a shows a layout tile with which to realize the embedding method illustrated in FIG. 11.
Figure 17B:
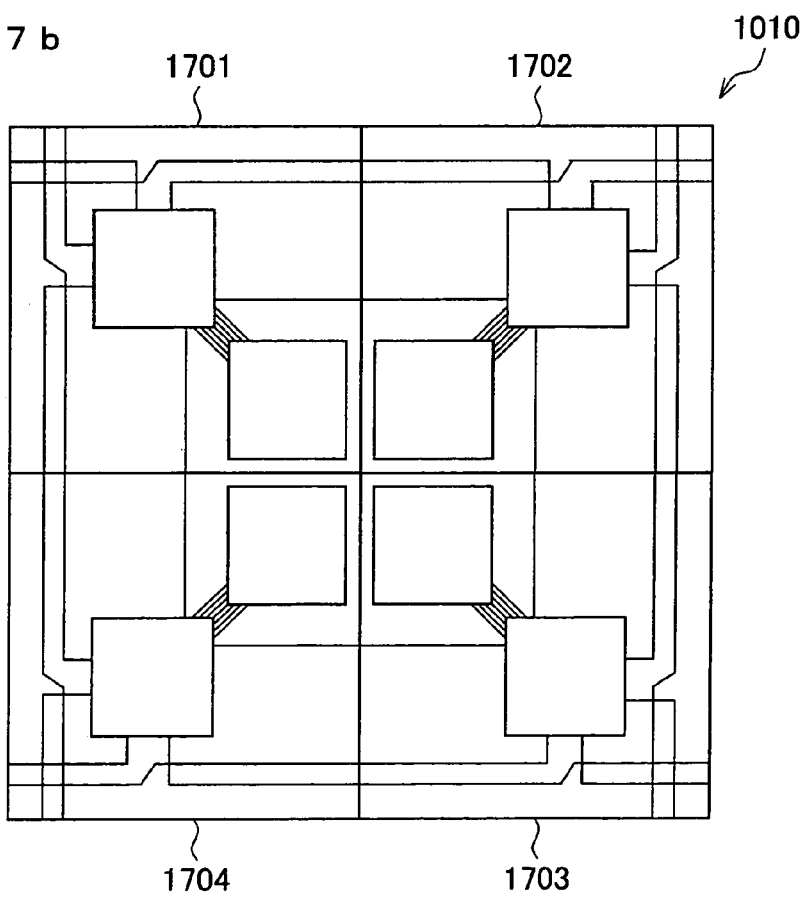
FIG. 17b shows an area of the FPGA in FIG. 11.

FIG. 17a shows a layout tile 1701 in a basic block with which to realize the method for embedding the FPGA 11 shown in FIG. 11. FIG. 17b shows the area 1010 in FIG. 10 formed by arranging a layout tile 1701 and similar layout tiles 1702 to 1704. The embedding shown in FIG. 11 is realized by arranging the area 1010 shown in FIG. 17b in a 2-dimensional array. The layout tiles 1701 to 1704 in FIG. 17b slightly differ in the arrangement (layout) of wires of the wire channels 503, 504. The designs of the tiles 1701 to 1704 need to be slightly different. Larger array sizes pose difficulty in layout tile design because an increased number of basic blocks containing 1-dimensional connections are folded and arranged in the area 1010.

Figure 18A:
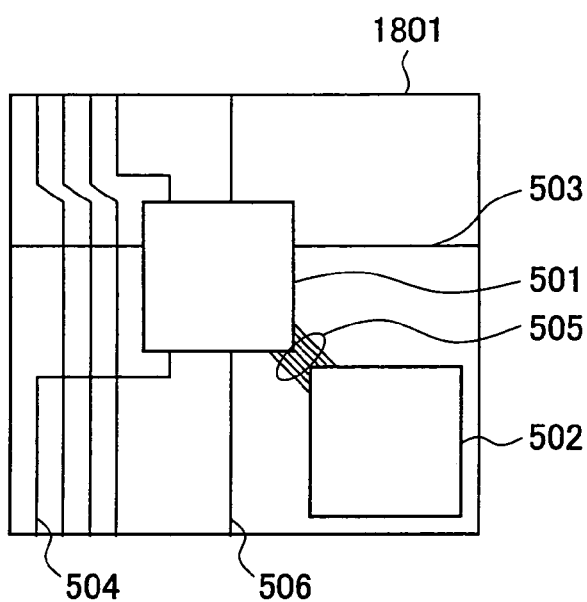
FIG. 18a shows a layout tile with which to realize the embedding method illustrated in FIG. 16.
Figure 18B:
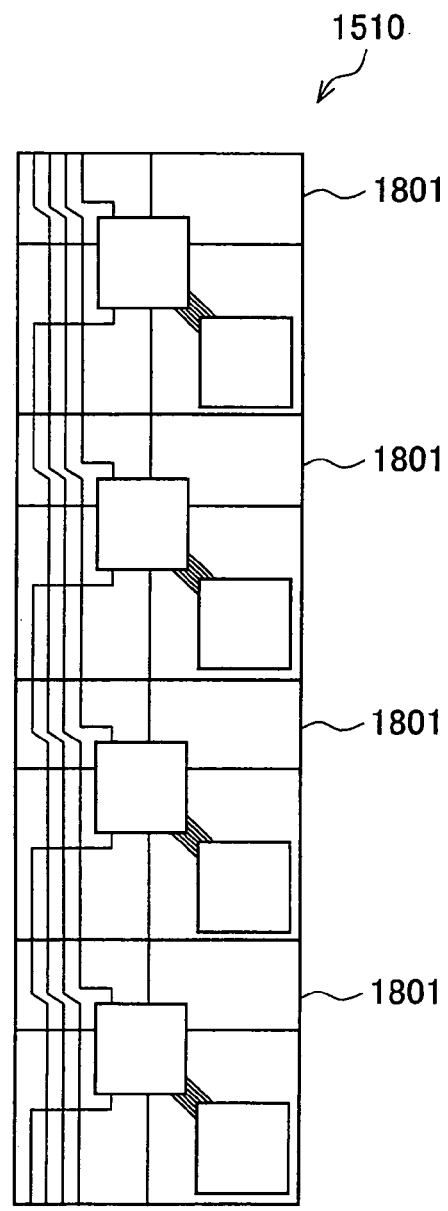
FIG. 18b shows an area of the FPGA in FIG. 16.

In contrast, FIG. 18a shows a layout tile 1801 in a basic block with which to realize the method for embedding the FPGA 16 shown in FIG. 16. FIG. 18b shows the area 1510 in FIG. 16 formed by arranging four layout tiles 1801. The embedding shown in FIG. 16 is realized by arranging the area 1510 shown in FIG. 18b in a 2-dimensional array. Here, the embedding is readily realized by arranging identical layout tiles 1801.

The embedding shown in FIGS. 15 and 16 is realized by arranging identical layout tiles. To reduce the aspect ratio, however, it is necessary in the examples in FIGS. 15 and 16 to increase the number of basic blocks in the x-direction and decrease the number of basic blocks in the y, z-directions. However, in view of wiring probability, the number of basic blocks arranged in the axial directions are preferably equal, that is, a cubic. This method becomes possible with a midway approach between the embedding method in FIGS. 15 and 16 and the embedding method in FIGS. 10 and 11. The approach involves reducing the number of times the interior of the area 1510 is folded and at the same time slightly reducing the number of basic blocks in the y, z-directions so as to reduce the aspect ratio of the chip as a whole and produce an array like a cubic. In a case like this, the number of times the interior of the area 1510 is folded is reduced; the layout tile design is relatively easy. However, it is necessary to carefully consider the number of basic blocks in each of the axial directions, the number of wire channel tracks, the number of times the interior of the area 1510 is folded, the chip's aspect ratio, etc.

In contrast, embedding a topology with even-numbered dimensions in a 2-dimensional chip is realized by repeatedly arranging identical tiles.

Figure 19A:
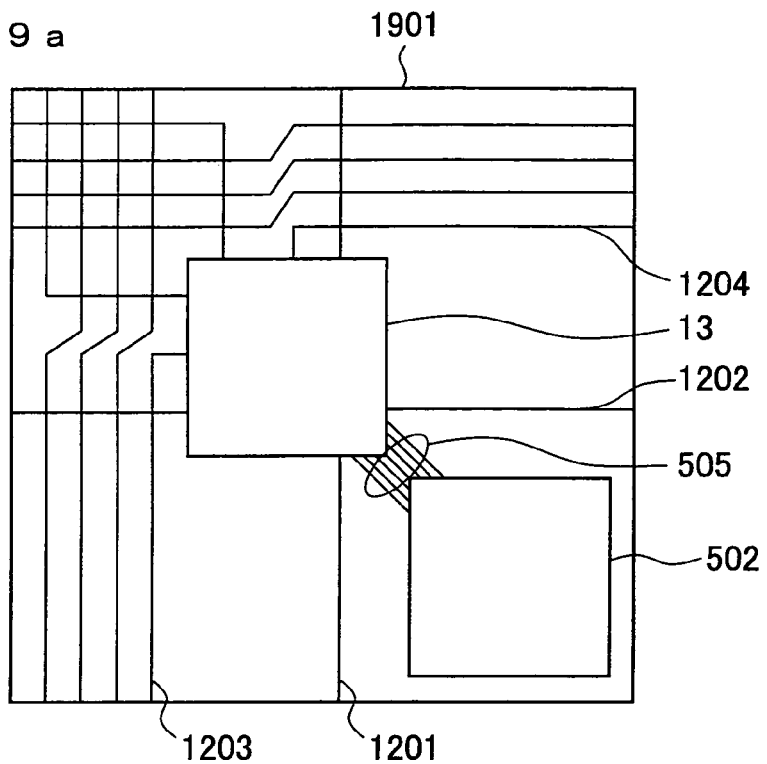
FIG. 19a shows a layout tile with which to realize the embedding method illustrated in FIG. 12.
Figure 19B:
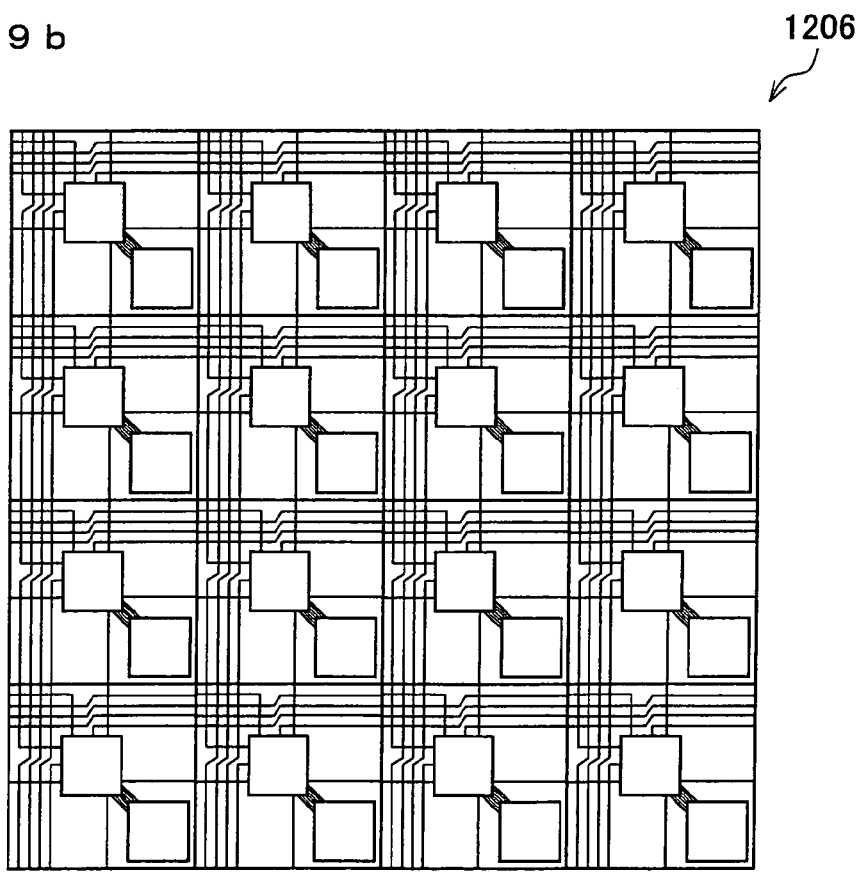
FIG. 19b shows an area of the FPGA in FIG. 12.

FIG. 19a shows a layout tile 1901 in a basic block with which to realize the method of embedding the 4-dimensional topology in FIG. 12 in a 2-dimensional chip. FIG. 19b shows the area 1206 in FIG. 12 formed by arranging layout tiles 1901 in a 4×4 matrix. In addition, the embedding method shown in FIG. 12 is realized by arranging the areas 1206 in a 3×3 matrix.

The layout tile 1901 in FIG. 19a may resemble a repeatable tile structure found in patent documents 1, 2, 5, 8, 9 in which intermediate length lines are present in mixture. The patent documents however do not mention the topology inside the switch matrix (see FIG. 13). In addition, in any of the examples given in the patent documents, there are no connections between the intermediate length wires and single length wires in a returning direction (1301 in FIG. 13). This is not a 4-dimensional topology.

In the patent documents, the tiles which extend along an intermediate length line and then in a returning direction can be connected traveling physically the shortest distance if the tiles extend via a single length line not the intermediate length line. There is no need for switches in the returning direction. However, to adds extra length to the intermediate length line, the tiles are preferably connected to a switch matrix at the midpoint of the intermediate length line. This leads to an increase in the number of switches.

In contrast, in FIG. 12, the wire channels 1203, 1204 which can be considered as corresponding to the intermediate length line in the patent documents connect to the switch matrix only at their ends. In addition, the 4-dimensional topology connection of wires in the axial directions in the switch matrix greatly improves wiring probability, which greatly reduces the number of channel tracks. Therefore, the number of switches are greatly reduced.

It is also effective to mix, in the examples, wires of various lengths, such as the intermediate length line in patent documents 1, 2, 5, 8, 9 (wires having a length separated by one or more basic blocks in an axial direction without being divided by a switch) and the full length line (wires running the entire length of the FPGA in an axial direction without being divided by a switch), in the axial directions and to build logic blocks in a hierarchical structure as in patent documents 6, 7, 11, 4, 10.

Results of Simulation

Simulation was performed on an FPGA with 2- to 4-dimensional topologies, using a benchmark circuit and a CAD tool, to examine integration and the number of switches required per basic block.

Figure 1B:
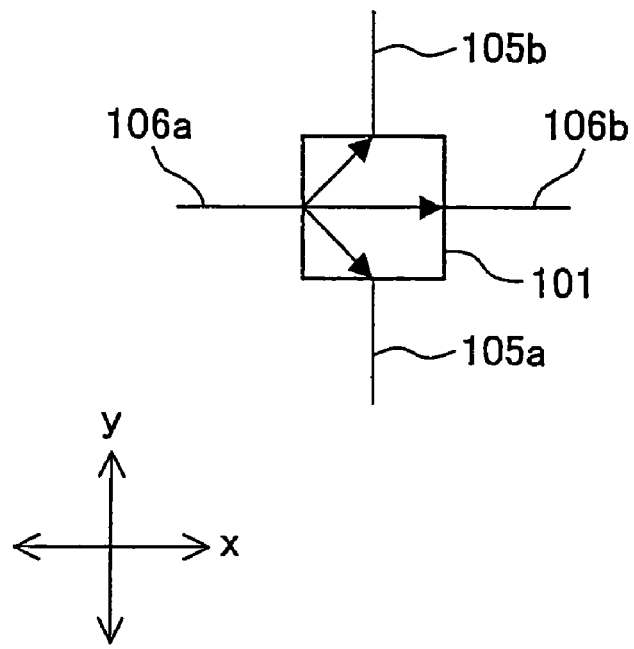
FIG. 1b is a schematic showing a topology of an FPGA switch matrix.
Figure 2:
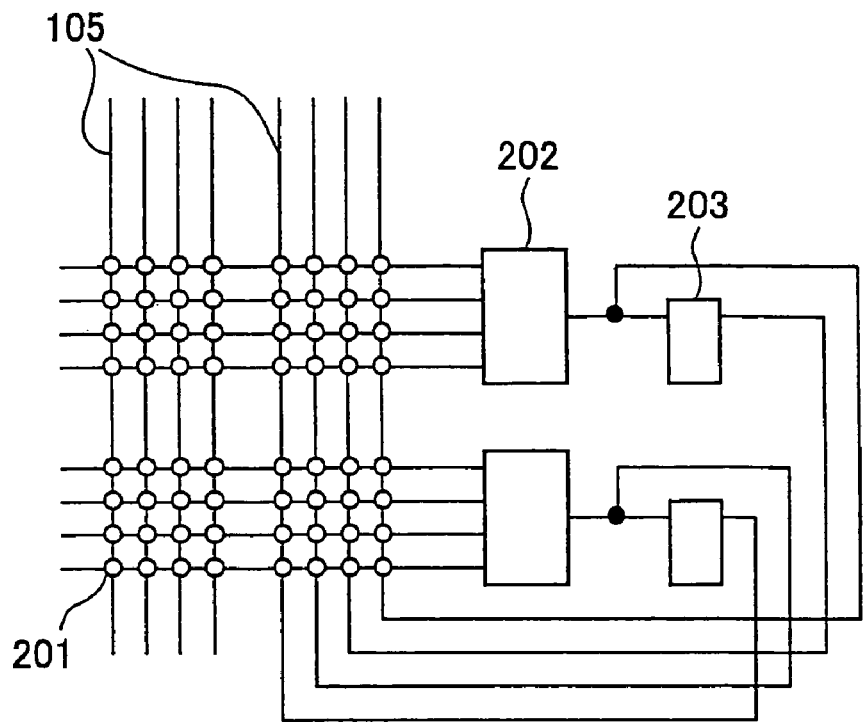
FIG. 2 shows an example of logic blocks.
Figure 3:
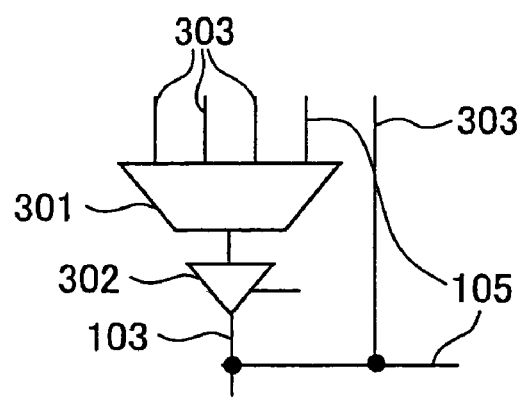
FIG. 3 shows an example of switches in a switch matrix.
Figure 6A:
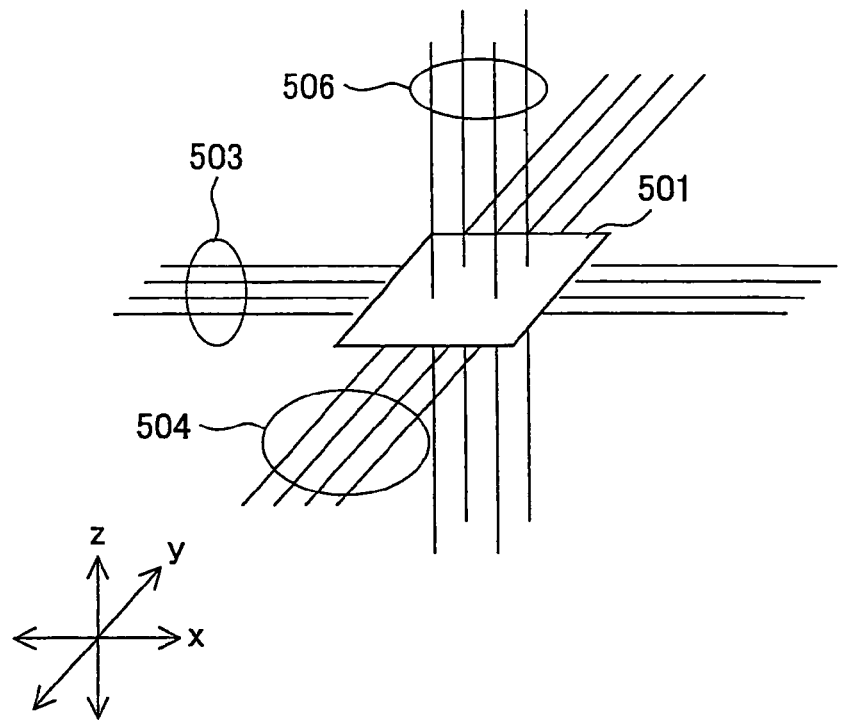
FIG. 6a is a solid view illustrating a switch matrix section in a 3-dimensional FPGA.
Figure 6B:
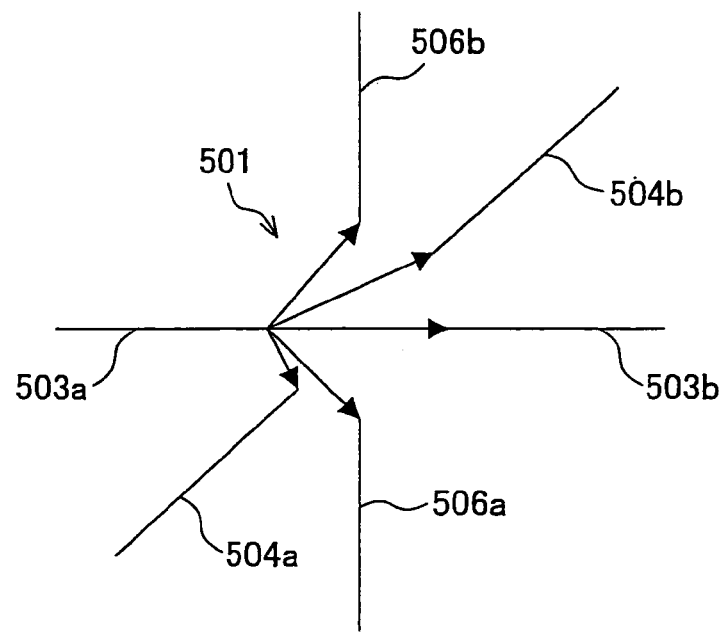
FIG. 6b is a schematic showing a topology of a 3-dimensional FPGA switch matrix.
Figure 7:
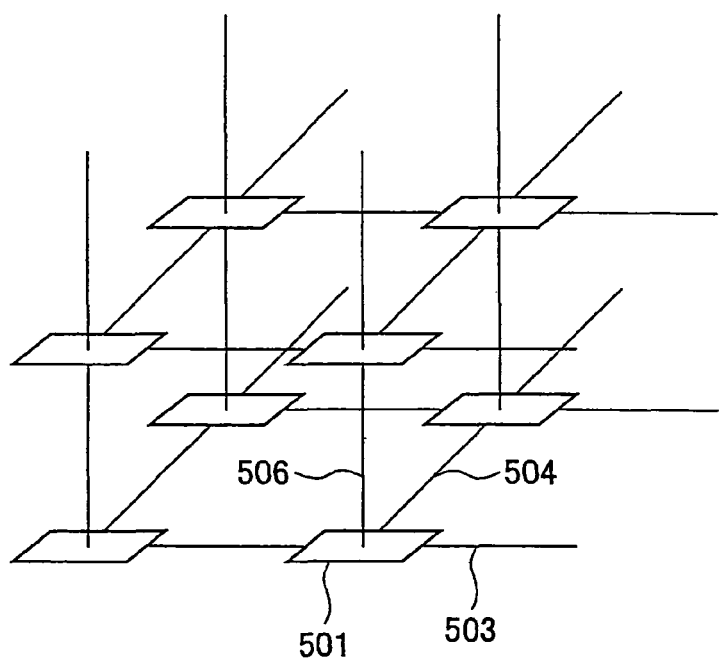
FIG. 7 shows a part of a 3-dimensional FPGA in which the switch matrices in FIG. 6a are arranged in three dimensions.
Figure 21A:
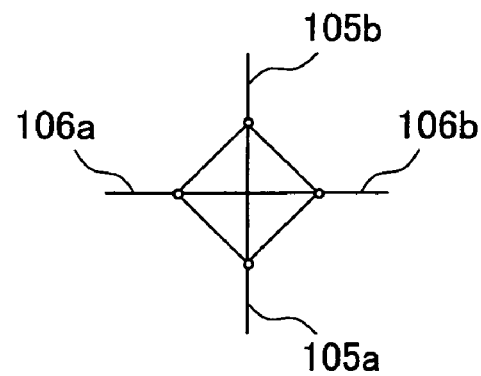
FIG. 21a shows a 2-dimensional switch topology.
Figure 21B:
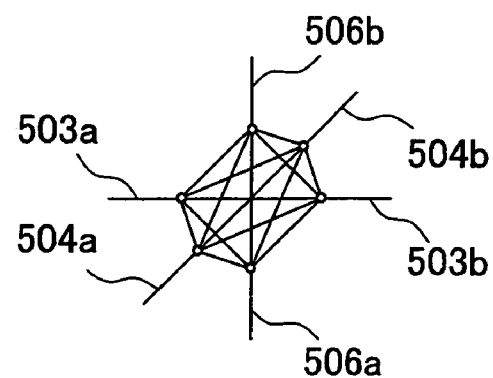
FIG. 21b shows a 3-dimensional switch topology.
Figure 21C:
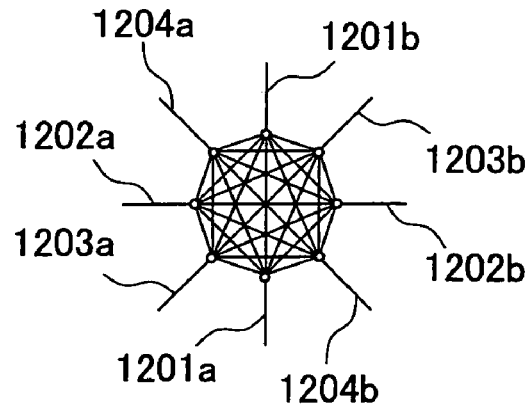
FIG. 21c shows a 4-dimensional switch topology.

In the simulation, a structure containing one 4-input LUT and the switch topology in FIG. 21a to FIG. 21c were assumed for the basic block. FIG. 21a shows a 2-dimensional switch topology (corresponding to FIG. 1a and FIG. 1b). FIG. 21b shows a 3-dimensional switch topology (corresponding to FIG. 5, FIG. 6a, and FIG. 6b). FIG. 21c shows a 4-dimensional switch topology (corresponding to FIG. 12 and FIG. 13). The ends of wires in the axial directions are indicated by white circles. The sides connecting white circles represent the locations of switches.

Figure 22:
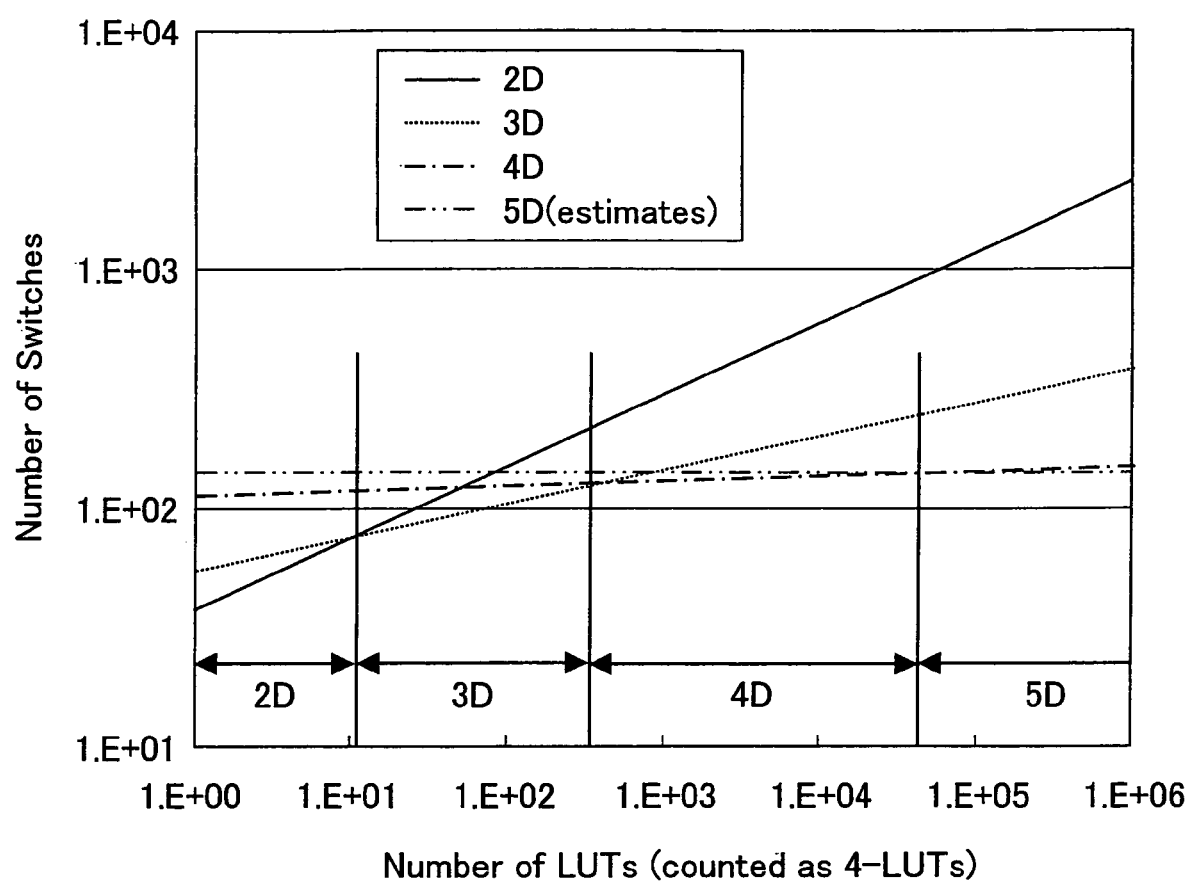
FIG. 22 is a graph showing the required number of switches per basic block in relation to LUT integration.

FIG. 22 shows the number of switches required per basic block for LUT integration. In FIG. 22, the 2- to 4-dimensional topology curves show simulation results. The 5-dimensional topology curve shows predictions based on 2- to 4-dimensional results. It is understood from FIG. 22 that the number of switches is minimum with two dimensions if the number of LUTs is from 1 to 20, three dimensions if from 20 to 400, four dimensions if from 400 to 60000, and five dimensions if 60000 or greater. Assuming that the switches are path transistors, an FPGA with a 2-dimensional topology needs six path transistor switches per track, an FPGA with a 3-dimensional topology needs 15 path transistor switches per track, and an FPGA with a 4-dimensional topology needs 27 path transistor switches per track. The higher the dimension, the greater the number of switches required. However, the number of wire channel tracks needed in an FPGA with a multidimensional topology is far less than the number of wire channel tracks required in an FPGA with a 2-dimensional topology with increasing integration. Multidimensional topologies are more advantageous by far in high integration FPGAs.

Technique to Embed 5- or 6-Dimensional FPGA in 2-Dimensional Chip

The embedding of a 5- or higher dimensional topology is realized by applying a 3- or 4-dimensional embedding method.

Figure 20:
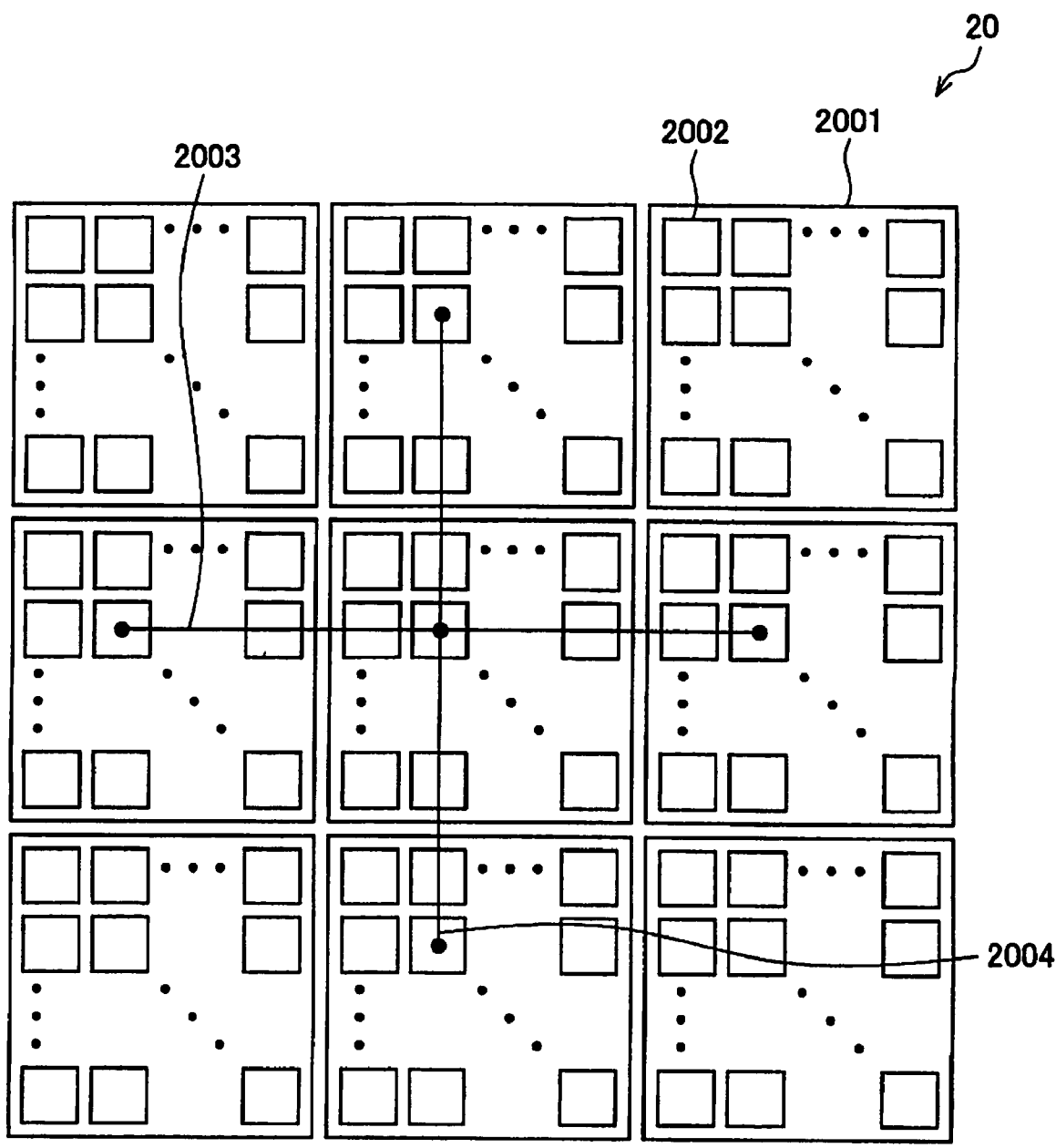
FIG. 20 shows an FPGA in which a 5- or 6-dimensional switch topology is embedded in a 2-dimensional chip.

FIG. 20 shows an FPGA 20 in which a 5- or 6-dimensional switch topology is embedded in a 2-dimensional chip. In the FPGA 20, basic blocks 2002 are arranged in 2-dimensional arrays to form areas (subregion) 2001 which are in turn arranged in a 2-dimensional array. Wire channels 2003, 2004 extending in two directions connect basic blocks located at the same positions in adjoining areas 2001 to each other.

If the area 2001 contains 3-dimensional topology connections in it as in FIG. 8 to 11, 15, or 16, the FPGA 20 has a 5-dimensional topology with the two axial directions (dimensions) corresponding to the wire channels 2003, 2004 being counted in. In addition, if the area 2001 contains it 4-dimensional topology connections as in FIG. 12, the FPGA 20 has a 6-dimensional topology with the two axial directions (dimensions) corresponding to the wire channels 2003, 2004 being counted in.

Technique to Embed in 3-Dimensional Chip

It is also possible to embed a 4- or higher dimensional multidimensional topology in a 3-dimensional chip by applying 3-dimensional integrated circuit technology.

Figure 23:
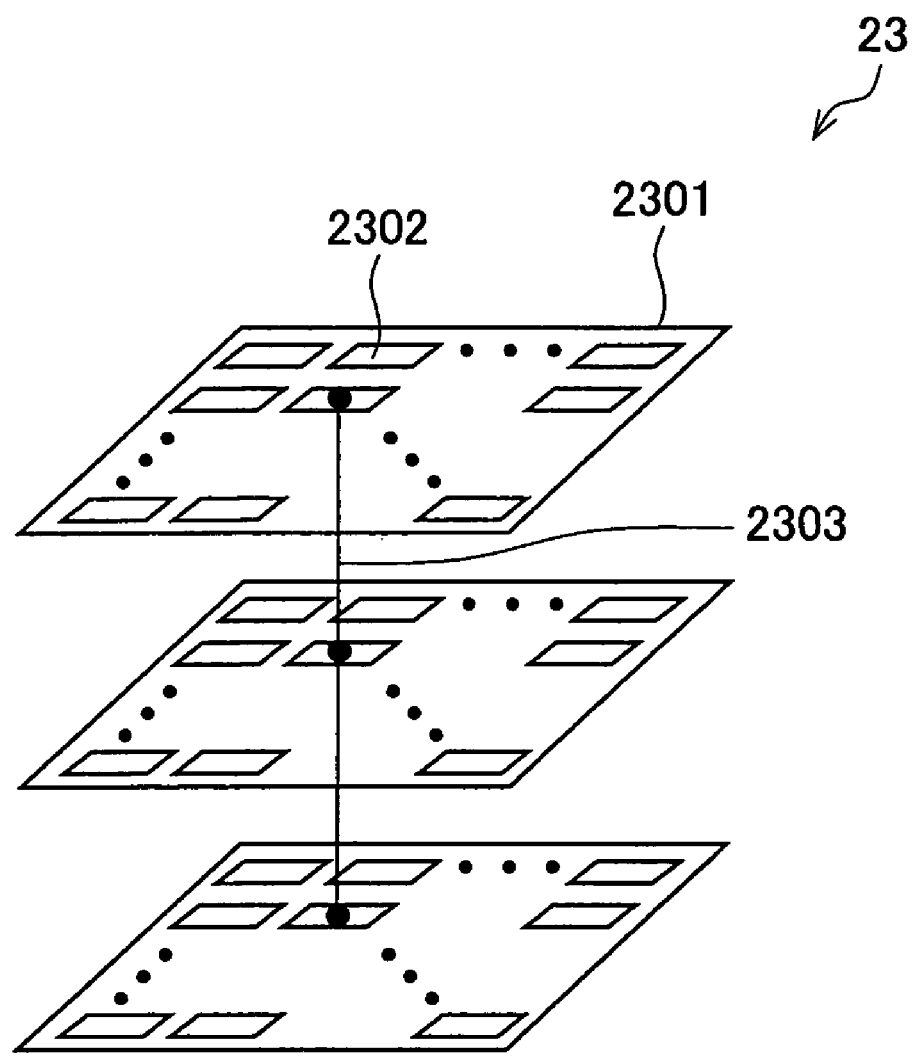
FIG. 23 shows an FPGA containing a 3-dimensional chip.

FIG. 23 shows a FPGA 23 built around a 3-dimensional chip. In the FPGA 23, the basic blocks 2302 are arranged in a 2-dimensional array to form areas (subregion) 2301 which in turn are stacked in multiple layers. Wire channels 2303 in one direction connect basic blocks located at the same positions in adjoining subregions (layers). If the area 2301 contains in it 3-dimensional topology connections as in FIGS. 8 to 11, 15, 16, the FPGA 23 has a 4-dimensional topology with the one axial direction (dimension) corresponding to the wire channel 2303 being counted in. In addition, if the area 2301 contains in it a 4-dimensional topology connections as in FIG. 12, the FPGA 23 has a 5-dimensional topology with the one axial direction (dimension) corresponding to the wire channel 2203 being counted in.

VARIATION EXAMPLES

The present embodiment has described applications of the present invention to FPGAs. In other words, the FPGAs in the present embodiment have a multidimensional topology. They include basic blocks of a multidimensional topology each containing a switch matrix (SM) and a logic block (LB). The basic blocks are arranged two or three dimensionally and connected with each other in a multidimensional topology.

However, the present invention is applicable to devices other than FPGAs. The invention is applicable to coarse grain size programmable devices containing functional circuitry, such as adders, multipliers, and memory, in place of the logic blocks in the FPGA.

The applications become possible by replacing the logic blocks with adders, multipliers, memory, etc., connecting them together in a multidimensional topology, and embedding in a 2-dimensional plane or a 3-dimensional space in accordance with the method shown in FIGS. 8 to 12, 15, 16, 20, 23.

In addition, the present invention is applicable to semiconductor integrated circuits which in part contains an FPGA or a coarse grain size programmable device.

As described above, the present invention is applicable to programmable devices including a plurality of basic blocks and switching elements, such as switch matrices, provided to each of the basic blocks to connect the basic blocks with each other.

In addition, it is assumed that connections between basic blocks are basically provided by metal wires; the connections may be partly or entirely provided by optical wires.

The features of the FPGAs of the present embodiment described so far can be described as follows:

First, the switch matrices in basic blocks are connected to the ends on one side of n (n is a natural number) bunches of wires. The ends on the other side of the bunch of wires are connected respectively to the switch matrices of different basic blocks. In each switch matrix, there are provided switches so that a signal is passed from at least one of wires in the j-th bunch of wires to at least one of wires in the k-th bunch of wires, for all combinations of j and k except for j=k, where j, k=1 to n.

Secondly, for the FPGAs 10, 11 shown in FIG. 10 and FIG. 11, n=6 regarding the foregoing first feature. The first and second bunches of wires connect to switch matrices in basic blocks which are separated by (l−1) basic blocks (l>1) respectively to the upward and downward directions. The third and fourth bunches of wires connect to switch matrices in basic blocks which are separated by (m−1) basic blocks (m>1) respectively to the rightward and leftward directions. Letting i, j represent natural numbers more than or equal to 1, the fifth and sixth bunches of wires for the basic blocks located at the (m×i)-th column, (l×(j−1)+2k−1)-th row where 1≦k<(l+1)/2) connect to adjoining switch matrices in basic blocks respectively to the leftward and upward directions. The fifth and sixth bunches of wires for the basic blocks located at the (m×(i−1)+1)-th column, (l×(j−1)+2k)-th row where 1≤k<1/2 connect to adjoining switch matrices in basic blocks respectively to the rightward and upward directions. The fifth and sixth bunches of wires for the basic blocks located at the (m×i)-th column, (l×(j−1)+2k)-th row where 1≤k≤1/2 connect to adjoining switch matrices in basic blocks respectively to the leftward and downward directions. The fifth and sixth bunches of wires for the basic blocks located at the (m×(i−1)+1)-th column, (l×(j−1)+2k+1)-row 1≤k≤(l−1)/2 connect to adjoining switch matrices in basic blocks respectively to the rightward and downward directions. The fifth and sixth bunches of wires for the basic blocks located at other positions connect to adjoining switch matrices in basic blocks respectively to the leftward and rightward directions.

Thirdly, for the FPGA 12 shown in FIG. 12, n=8 regarding the foregoing first feature. The first, second, third, and fourth bunches of wires connect to adjoining switch matrices in basic blocks respectively to an upward, rightward, downward, and leftward directions. The fifth and seventh bunches of wires connect to switch matrices in basic blocks separated by (l−1) basic blocks (l>1) respectively to the upward and downward directions. The sixth and eighth bunches of wires connect to switch matrices in basic blocks separated by (m−1) basic blocks (m>1) respectively to the rightward and leftward directions.

Fourthly, for the FPGAs 15, 16 shown in FIG. 15 and FIG. 16, regarding the foregoing first feature, the first, second, third, and fourth bunches of wires connect to adjoining switch matrices in basic blocks respectively to the upward, rightward, downward, and leftward directions. The fifth and sixth bunches of wires connect to switch matrices in basic blocks separated by (l−1) basic blocks (l>1) respectively to the upward and downward directions.

INDUSTRIAL APPLICABILITY

The present invention is applicable to programmable devices typically represented by the FPGA.

The invention claimed is:

1. A method of designing an FPGA, comprising embedding an interconnected n-dimensional FPGA switch topology in an m-dimensional integrated circuit, where m and n are natural numbers, m<n, and 4≤n.

2. The method of claim 1, wherein m=2 and n=4.

3. A semiconductor integrated circuit, comprising an FPGA including an interconnected n-dimensional FPGA switch topology embedded in an m-dimensional integrated circuit, where m and n are natural numbers, m<n, and 4≤n.

4. The semiconductor integrated circuit of claim 3, wherein m=2 and n=4.

5. The semiconductor integrated circuit of claim 3, wherein in the FPGA, wire channels in axial directions associated with the m dimensions include wires of various lengths.

6. The semiconductor integrated circuit of claim 3, wherein in the FPGA, wire channels in axial directions associated with the m dimensions include wires of full length.

7. The semiconductor integrated circuit of claim 3, wherein in the FPGA, closely located wire channels in axial directions associated with the m dimensions have ends connected to one another.

8. The semiconductor integrated circuit of claim 3, wherein in the FPGA, each basic block has a hierarchical structure.

9. A semiconductor integrated circuit, comprising an FPGA including a 3-dimensional FPGA switch topology embedded in a 2-dimensional integrated circuit,
wherein in the FPGA:
basic blocks located at the same x-y position are constructed 2-dimensionally as a single subregion;
connections are made in a z-direction;
the subregions are arranged in a 2-dimensional array;
connections are made in an x-direction between basic blocks located at the same z position in subregions adjoining in a lateral direction; and
connections are made in a y-direction between basic blocks located at the same z position in subregions adjoining in a longitudinal direction, wherein in each subregion in the FPGA, wire channels in the z-direction each have a lower end and an upper end connected to each other.

10. The semiconductor integrated circuit of claim 4, wherein in the FPGA:
basic blocks located at the same u-v position are constructed in a 2-dimensional array as a single subregion;
connections are made in an x-direction between basic blocks adjoining in a lateral direction;
connections are made in a y-direction between basic blocks adjoining in a longitudinal direction;
the subregions are arranged in a 2-dimensional array;
connections are made in a u-direction between basic blocks located at the same x-y position in subregions adjoining in the lateral direction; and
connections are made in a v-direction between basic blocks located at the same x-y position in subregions adjoining in the longitudinal direction.

11. The semiconductor integrated circuit of claim 9, wherein in the FPGA, the subregions are arranged 2-dimensionally so that basic blocks adjoining in the z-direction adjoin each other.

12. The semiconductor integrated circuit of claim 10, wherein in the FPGA, wire channels in the y-direction in a first subregion each have a lower end connected to an upper end of one of wire channels in the y-direction in a second subregion which is immediately below the first subregion.

13. The semiconductor integrated circuit of claim 10, wherein in the FPGA, wire channels in the x-direction in a first subregion each have a right hand end connected to a left hand end of one of wire channels in the x-direction in a second subregion which is immediately to the right of the first subregion.

14. The semiconductor integrated circuit of claim 11, wherein in the FPGA, the subregions are constructed by arranging the basic blocks linearly in the longitudinal direction.

15. The semiconductor integrated circuit of claim 11, wherein in the FPGA, the subregions are constructed by folding a z-axis at least once to arrange the basic blocks.

16. The semiconductor integrated circuit of claim 14, wherein in the FPGA, wire channels in the z-direction in a first subregion each have a lower end connected to an upper end of one of wire channels in the z-direction in a second subregion which is immediately below the first subregion.

17. A programmable device, comprising:
basic blocks; and
switching elements provided to the basic blocks, the basic blocks being connected to one another via the associated switching elements,
wherein:
at least some of the basic blocks are arranged in a matrix and constitute basic block matrices in which those particular basic blocks are sequentially connected in rows and columns;
basic blocks located at corresponding matrix positions in the basic block matrices are connected to one another;
the basic block matrices are arranged in a plane;

basic blocks located at corresponding matrix positions in the basic block matrices are located together in a predetermined area; and the programmable device includes an n-dimensional switch topology in an m-dimensional integrated circuit, where m and n are natural numbers, m<n, and 4≦n.

18. The programmable device of claim 17, wherein basic blocks located at corresponding matrix positions in the basic block matrices are connected 1-dimensionally to each other.

19. A programmable device, comprising:

basic blocks; and switching elements provided to the basic blocks, the basic blocks being connected to one another via the associated switching elements, wherein:

at least some of the basic blocks are arranged in a matrix and constitute basic block matrices in which those particular basic blocks are sequentially connected in rows and columns;

basic blocks located at corresponding matrix positions in the basic block matrices are connected to one another;

the basic block matrices are arranged in a plane;

basic blocks located at corresponding matrix positions in the basic block matrices are connected 2-dimensionally to one another; and the programmable device includes an n-dimensional switch topology in an m-dimensional integrated circuit, where m and n are natural numbers, m<n, and 4≦n.

20. The programmable device of claim 19, wherein those basic blocks which constitute the basic block matrices are located together in a predetermined area.

21. The semiconductor integrated circuit of claim 9, wherein the wire channels in the z-direction are connected to each other at their ends to form a loop.

* * * * *